United States Patent [19]
Ihara

[11] Patent Number: 5,388,076
[45] Date of Patent: Feb. 7, 1995

[54] SEMICONDUCTOR MEMORY DEVICE
[75] Inventor: Makoto Ihara, Sakurai, Japan
[73] Assignee: Sharp Kabushiki Kaisha, Osaka, Japan
[21] Appl. No.: 87,157
[22] Filed: Jul. 2, 1993
[30] Foreign Application Priority Data
  Jul. 3, 1992 [JP] Japan .................. 4-177247
[51] Int. Cl.6 .................. G11C 7/00; G11C 29/00
[52] U.S. Cl. .................. 365/200; 365/201; 365/230.030
[58] Field of Search .................. 365/200, 201, 230.03, 365/189.01, 185

[56] References Cited
U.S. PATENT DOCUMENTS
4,575,819 3/1986 Amin .................. 365/230.01
4,855,803 8/1989 Azumai et al. .................. 365/156

FOREIGN PATENT DOCUMENTS
57-53899 3/1982 Japan .
2-201800 8/1990 Japan .
2-210697 8/1990 Japan .
04155454 5/1992 Japan .
9220068 11/1992 WIPO .................. 365/200

Primary Examiner—Eugene R. LaRoche
Assistant Examiner—Tan Nguyen
Attorney, Agent, or Firm—Morrison & Foerster

[57] ABSTRACT

The semiconductor memory device according to this invention includes both ROM cells and RAM cells mixed on one line of memory cells. The semiconductor memory device further has a redundant ROM bit line and a redundant RAM bit line. An address on the redundant ROM or RAM bit line is selected in accordance with whether the corresponding address on a defective line to be replaced with the redundant ROM or RAM bit line is a RAM or a ROM. Therefore, it is possible to redundantly recover a defective line including both ROMs and RAMs. Further, a semiconductor memory device including ROMs and RAMs mixedly can be produced in a high yield.

23 Claims, 22 Drawing Sheets

SEMICONDUCTOR MEMORY DEVICE

BACKGROUND OF THE INVENTION

1. Field of the Invention

The present invention relates to a semiconductor memory device. More particularly, the present invention relates to a redundant means in a semiconductor memory device in which ROMs and RAMs are both present in one chip. The present invention also relates to a redundant means in a semiconductor memory device in which ROMs and RAMs are both present on one line (a row or column line).

2. Description of the Related Art

FIG. 14 shows a part of a circuit in a conventional semiconductor memory device in which ROM cells 35 and RAM cells 34 are both present in one chip. FIG. 14 schematically shows a memory cell array 1, a row decoder 2, a column decoder 3, a data line readout circuit 5, word lines 30, bit line pairs 47, etc. of the semiconductor memory device.

In the memory cell array 1, the memory cells are arranged on row lines and column lines. The "row line" herein corresponds to the word line 30, and the "column line" herein corresponds to the bit line pair 47. In the semiconductor memory device shown in FIG. 14, the ROM cells 35 and the RAM cells 34 are both present on each column line.

A number of the word lines 30 in a memory block shown in FIG. 14 is 256. The row decoder 2 decodes row addresses (RA0–RA7), thereby selecting one word line from the 256 word lines 30. The word line 30 selected when all the row addresses (RA0–RA7) are 0 is taken as a 0th word line. The word line 30 selected when all the row addresses (RA0–RA7) are 1 is taken as a 255th word line. One address in the memory cell array 1 is designated by a first address signal (a column address signal) for selecting one line in the memory cell array 1 and a second address signal (a row address signal) for selecting one address on the selected line.

FIGS. 11a and 11b show an example of the column decoder 3 and the row decoder 2, respectively. The row decoder 2 decodes a row address signal to activate one word line among the plurality of the word lines 30. The column decoder 3 decodes a column address signal to activate one of a plurality of column selecting signal lines 46. Memory cells belonging to the word line 30 which has been selected, i.e., activated, are electrically connected to the bit line pairs 47, thereby causing a potential difference in each of the bit line pairs 47 in response to the data stored in the selected memory cells.

The potential difference is amplified by a sense amplifier 37. A potential difference in the bit line pair 47 selected by the column selecting signal line 46 is output to a data line pair 6 (hereinafter referred to as the "data line") via a transfer gate. The potential difference output to the data line 6 is amplified by the data readout circuit 5 and transferred to an output circuit 4.

This semiconductor memory device comprises both ROM cells and RAM cells in one memory cell array. As a result, the ROM cells and the RAM cells are both present on one line in the memory block shown in FIG. 14.

FIG. 17 shows the construction of the semiconductor memory device comprising a plurality of the memory blocks as shown in FIG. 14. FIG. 18 shows the construction of a semiconductor memory device comprising both ROM cells and RAM cells in one chip, in which each memory block includes either ROM cells or RAM cells.

Next, the structures of the RAM cell 34 and the ROM cell 35 will be described referring to FIGS. 20a through 20d. FIG. 20a shows a first example of the RAM cell 34. This RAM cell 34 is a known DRAM cell. Its operations such as a readout operation are well known. FIG. 20b shows a first example of the ROM cell 35. This ROM cell 35 has a structure in which a potential of a storage node a1 in the DRAM cell as shown in FIG. 20a is fixed to Vcc or GND. The operations such as a readout operation of such a ROM cell 35 can be performed by the same method as in the DRAM cell as shown in FIG. 20a. Data is written in this ROM cell 35 in the earlier step (a wafer process) as follows: Data, 1 or 0, is stored in each ROM cell 35 by varying a connection shown with an arrow in FIG. 20b by varying the pattern on a photomask.

FIG. 20c shows a second example of the RAM cell 34. This RAM cell 34 is a known SRAM cell. Its operations such as a readout operation are also well known. FIG. 20d shows a second example of the ROM cell 35. This ROM cell 35 has a structure in which potentials of nodes c1 and c2 in a flip flop of an SRAM cell as shown in FIG. 20c are fixed to Vcc and GND or GND and Vcc, respectively. Therefore, the operations such as a readout operation of such a ROM cell 35 can be performed by the same method as in the SRAM cell as shown in FIG. 20c.

FIG. 15 shows a part of a conventional RAM cell block having a redundant element. Like reference numerals are used to refer to like elements throughout.

In order to recover a defective line redundantly, a line of memory cells including a defective bit (a defective line) is deactivated, and a redundant RAM bit line pair 347 is selected instead of the defective line. Memory cells 34 on the redundant RAM bit line pair 347 are generally disposed adjacent to the ordinary RAM cells 34 in the memory cell array 1. This is because the structure of the RAM cell 34 on the redundant RAM bit line pair 347 can be identical to that of the ordinary RAM cells 34. The RAM cells 34 on the redundant RAM bit line pair 347 can be operated in the same manner as the ordinary RAM cells 34.

FIG. 21 shows an example of a circuit for a redundant RAM column decoder 303. By using this column decoder 303, it is possible to program the column address of a defective line to be replaced in the later step after the wafer test. When the redundant column address which has been programmed corresponds to an externally input column address, a redundant RAM column selecting signal is output. The column address is programmed by melting fuses selected among a plurality of address program fuses depending upon each address. When the column decoder 303 shown in FIG. 21 is used as a row decoder, the wording "column address" in the above description should read the "row address".

A redundant replacement in the semiconductor memory device having the redundant RAM bit line pair 347 will now be described. The column address of a bit line pair 47 including a defective bit is programmed in the redundant RAM column decoder 303. As shown in FIG. 21, a pair of fuses corresponds to one bit in the column address. By melting one of the fuses by using a laser trimming, the defective column address can be memorized. A redundant RAM column activating fuse is also melted at the same time as the melting of the above fuse. When the redundant RAM column activating fuse is melted, a node (a control terminal) 13a is defined to be at a high level in switching on a power supply. When this fuse is not melted, the node 13a is always at a low level. When the node 13a is at the low level, the output terminals of an inverter 13b with a control terminal and a buffer 13c with a control terminal are in a high impedance state. When the node 13a is at the high level, signals can be output on the output terminals of the inverter 13b and the buffer 13c. Therefore, when the redundant RAM activating fuse is melted, a redundant RAM column selecting signal is output if the programmed redundant column address corresponds to an externally input column address. When the redundant RAM activating fuse is not melted, a redundant RAM column selecting signal is not output since the input of an AND circuit is always at the low level.

Moreover, the defective address is deactivated in the column decoder as shown in FIG. 11a so as not to select the column address on the defective bit line as follows: Fuses corresponding to a column selecting signal for the defective column in the column decoder as shown in FIG. 11a are melted by using a laser trimming. As a result, a column selecting signal 46 for the defective column is not output.

FIG. 16 shows a part of a conventional ROM cell block having a redundant element.

In order to recover a defective line redundantly, a bit line 147 including a defective bit (a defective line) is deactivated, and when the defective line is selected, a redundant ROM bit line 247 is selected instead. Redundant ROM cells 36 on the redundant ROM bit line 247 are generally disposed outside of the memory cell array 1 independently from the ordinary ROM cells 35. This is because the redundant ROM cell 36 is larger than the ordinary ROM cell 35 in the memory cell array 1. A redundant ROM row decoder 202b for the redundant ROM bit line 247 is provided independently from the ordinary row decoder 2.

This circuit for the ROM cells is different from that of the RAM cells shown in FIG. 15 in the following: The bit line pair 47 is replaced with the bit line 147. The sense amplifier 37 is provided not to each bit line 147 but to each memory cell array 1. A bit line selected by the column decoder 3 is connected to the single sense amplifier 37.

FIG. 21 shows an example of a circuit for the redundant ROM column decoder 203. By using this redundant ROM column decoder 203, a column address on the defective line to be replaced can be programmed in the later step after the wafer test. When the programmed redundant column address corresponds to an externally input column address, a redundant ROM column selecting signal is output. The column address is programmed by melting fuses selected among a plurality of the address program fuses depending upon each address.

The redundant ROM bit line 247 in FIG. 16 will now be described in detail.

An example of the redundant ROM cell 36 on the redundant ROM bit line 247 is shown in FIG. 20e. The ROM data can be written in the redundant ROM cells 36 depending upon whether or not the fuse shown in FIG. 20e is melted by using a laser trimming in the later step after a wafer process and the wafer test. The structure of the memory cell shown in FIG. 20e can be readily understood when compared with that of a known mask ROM cell shown in FIG. 20f. Whether or not the fuse in the memory cell of FIG. 20e is melted indicates whether or not the threshold value of the mask ROM cell of FIG. 20f is high. Therefore, operations such as the readout of the redundant memory cell can be performed in the same manner as a known mask ROM cell.

A redundant replacement of a semiconductor memory device having the redundant ROM bit line will now be described.

A column address on a bit line including a defective bit is programmed in the redundant ROM column decoder as shown in FIG. 21. A pair of fuses corresponds to one bit of the column address. The address of the defective line can be memorized by melting one of the pair of fuses by using a laser trimming. A redundant ROM column activating fuse is melted at the same time as the melting of the above fuse. When the redundant ROM column activating fuse is melted, the node 13a is defined to be at the high level in switching on a power supply. When this fuse is not melted, the node 13a is always at the low level. When the node 13a is at the low level, the output terminals of the inverter 13b with a control terminal and the buffer 13c with a control terminal are in a high impedance state. When the node 13a is at the high level, signals can be output on the output terminals of the inverter 13b and the buffer 13c. Therefore, when the redundant ROM activating fuse is melted, a redundant ROM column selecting signal 48 is output if the programed redundant column address corresponds to an externally input column address. When the redundant ROM activating fuse is not melted, the redundant ROM column selecting signal 48 is not output since the input of an AND circuit is always at the low level.

Moreover, the defective address is deactivated in the column decoder as shown in FIG. 11b so as not to select the column address on the defective bit line as follows: Fuses corresponding to a column selecting signal for the defective column in the column decoder as shown in FIG. 14 are melted by using a laser trimming. As a result, a column selecting signal 46 for the defective column is not output. Further, data on the ROMs on the defective line are programmed in the ROM cells 36 in the row addresses on the redundant ROM bit line 247. Namely, fuses corresponding to a desired row address are melted.

FIG. 12 shows a redundant ROM row decoder 202b. The redundant ROM row decoder 202b receives a row address signal and the redundant ROM column selecting signal 48, and activates the designated one redundant ROM row selecting signal line 31 when the redundant ROM column selecting signal 48 is activated. In this manner, a redundant ROM cell 36 selected by the redundant ROM row selecting signal line 31 is connected to the redundant ROM bit line 247. Data on the redundant ROM bit line 247 is read out by a redundant ROM bit line readout circuit 205 and transferred to the output circuit 4. The sense amplifier 37 works when the redundant ROM column selecting signal is not activated, and the redundant ROM bit line readout circuit 205 works when the redundant ROM selecting signal is activated. Thus, a defective line of ROMs is recovered redundantly.

In order to produce a semiconductor memory device in which ROM cells and RAM cells are both present, a redundant technique for replacing a memory cell in which a defect has been caused in the production process with a spare memory cell is indispensable to increase the yield. However, a conventional RAM redundant is effective only in the redundant recovery of a memory cell array including RAM cells alone, and a conventional ROM redundant is effective only in the redundant recovery of a memory cell array including ROM cells alone.

A semiconductor memory device including both RAM and ROM cells requires redundant elements for both ROM and RAM cells, respectively. Specifically, in a semiconductor memory device including both ROM and RAM cells in one chip as shown in FIG. 18, it is necessary to provide a redundant element for ROM cells or RAM cells to each memory cell array as shown in FIG. 19.

Alternatively, in a semiconductor memory device including both ROM and RAM cells in one memory cell array as shown in FIG. 17, when a defective line (a row or column line) including both ROM and RAM cells is replaced with, for example, a redundant RAM line, all the memory cells on the replaced line become RAM cells as shown in FIG. 22. On the contrary, when the defective line is replaced with a redundant ROM line, all the memory cells on the replaced line become ROM cells as shown in FIG. 23.

When the defective line is replaced with a redundant ROM line and a redundant RAM line as shown in FIG. 24, a butting between an address on the replaced redundant ROM line and that on the replaced redundant RAM line is caused. This butting will be described in detail referring to FIG. 24.

FIG. 24 is a schematic view of a semiconductor memory device in which ROM cells and RAM cells are both present on one line and in which data is written in a ROM cell in the earlier step. This semiconductor memory device requires both a redundant RAM line and a redundant ROM line in which data can be written in the later step, because both ROM cells and RAM cells on a defective line should be replaced to redundantly recover a defective line. When a redundant RAM line and a redundant ROM line are replaced with a defective line, addresses on both the redundant RAM line and the redundant ROM line are arranged on addresses on the same defective line. Therefore, when the defective line is designated by a first address signal, the redundant RAM line and the redundant ROM line are both selected, thereby causing a butting.

As described above, in a semiconductor memory device in which ROM cells and RAM cells are both present on one line, it has been impossible to redundantly recover a defective line. Therefore, such a semiconductor memory device has a poor yield, and it has been difficult to produce such a semiconductor memory device.

SUMMARY OF THE INVENTION

The semiconductor memory device of this invention comprises a plurality of memory cells on one chip, and the plurality of memory cells include a ROM cell and a RAM cell. The semiconductor memory device further comprises a ROM redundant means for redundantly recovering the ROM cell and a RAM redundant means for redundantly recovering the RAM cell.

Alternatively, the semiconductor memory device comprises a memory cell array in which memory cells are arranged on a plurality of row lines and column lines. An address on the memory cell array is selected by a first address signal for designating one line among the plurality of lines and a second address signal for designating one address on the line designated by the first address signal. At least one line of the plurality of lines has both ROM cells and RAM cells mixed, and the semiconductor memory device further comprises a redundant line for replacing a defective line among the plurality of lines.

Thus, the invention described herein makes possible the advantage of providing a semiconductor memory device in which ROM cells and RAM cells are both present on one line and in which a butting of addresses is not caused when a defective line is replaced with a redundant line.

This and other advantages of the present invention will become apparent to those skilled in the art upon reading and understanding the following detailed description with reference to the accompanying figures.

DESCRIPTION OF THE PREFERRED EMBODIMENTS

The present invention will now be described by way of examples with reference to the accompanying drawings.

EXAMPLE 1

Figure 1:
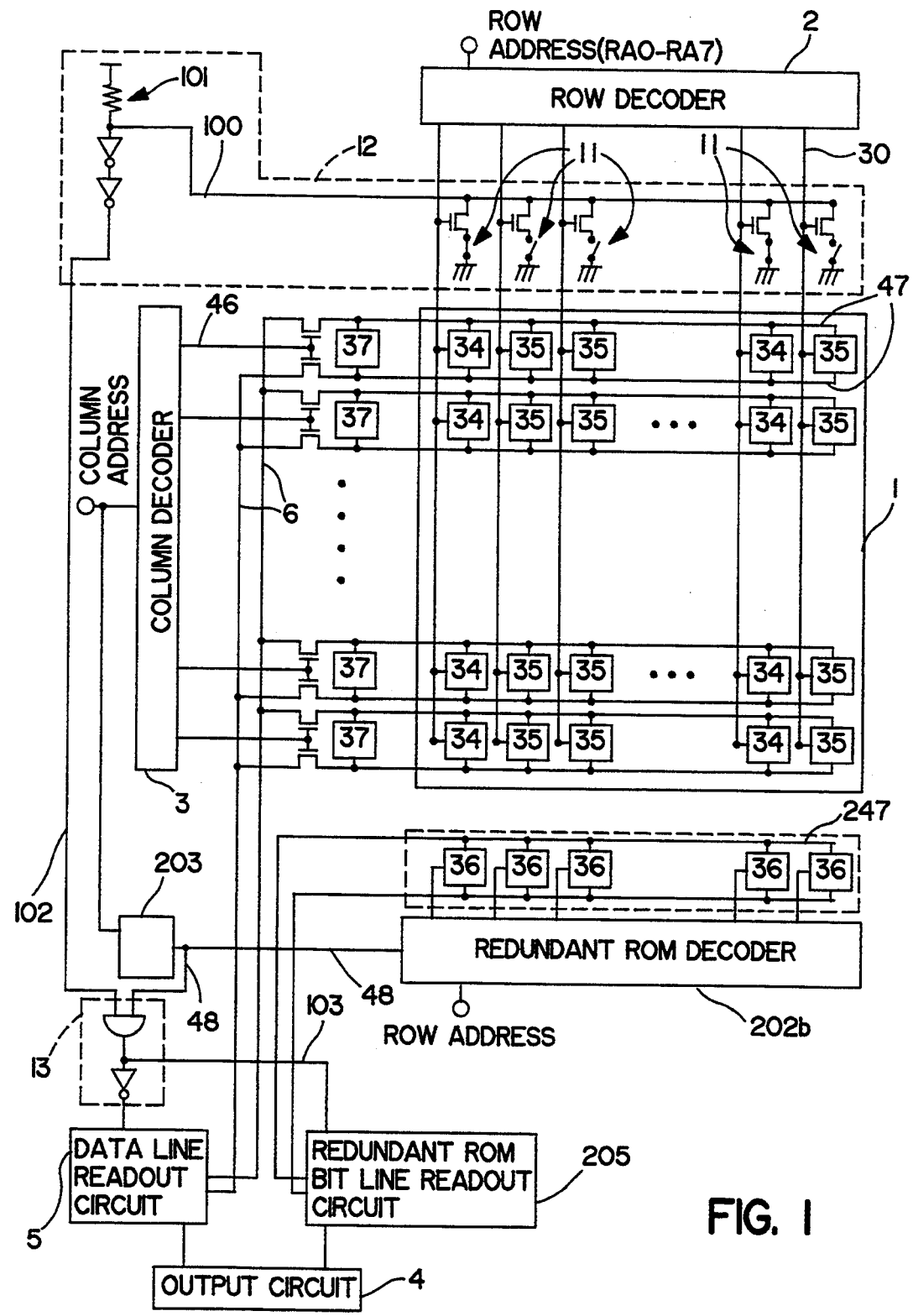
FIG. 1 shows a configuration for a semiconductor memory device according to Example 1 of the present invention.

FIG. 1 shows a configuration for a semiconductor memory device according to Example 1 of the present invention. The semiconductor memory device comprises a memory cell array 1, a row decoder 2, a column decoder 3, an output circuit 4, a data line readout circuit 5, word lines 30, bit line pairs 47, etc. The semiconductor memory device further includes, as redundant elements, redundant ROM bit line pairs 247, a redundant ROM bit line readout circuit 205, a redundant ROM row decoder 202b and a redundant ROM column decoder 203.

In the memory cell array 1, memory cells are arranged on row lines and column lines. In this example, ROM cells 35 and RAM cells 34 are both present on a line parallel to the bit line pairs 47, i.e., on a column line. The ROM cells 35 alone or the RAM cells 34 alone are present on a line parallel to the word lines 30, i.e., on a row line. A number of the word line 30 in a memory block is, for example, 256. The row decoder 2 decodes a row address (RA0-RA7), thereby selecting one word line from the 256 word lines 30.

In this example, one address in the memory cell array 1 is designated by a first address signal (a column address signal) for designating one line among the plurality of column lines and a second address (a row address signal) for designating one address on the line selected by the first address signal. The row decoder 2 decodes a row address signal, thereby activating one word line among the plurality of the word lines 30. The column decoder 3 decodes a column address signal, thereby activating one of a plurality of column selecting signal lines 46. As a result, a memory cell belonging to the selected (activated) word line 30 is electrically connected to the bit line pair 47, thereby causing a potential difference in the bit line pair 47 in accordance with data stored in the memory cell. The potential difference is amplified by a sense amplifier 37. The potential difference in the bit line pair 47 selected by the column selecting signal line 46 is output to a data line 6 through a transfer gate. The potential difference output to the data line 6 is amplified by the data line readout circuit 5 and transferred to the output circuit 4.

The semiconductor memory device of this example further has a ROM/RAM decision element 12 (a second means) including a plurality of memory elements 11 (a first means) and a control element 13 (a third means).

Each of the memory elements 11 stores data whether a row address on the bit line pair 47 is a ROM or a RAM in the earlier step (the wafer process) in the same manner as writing of the ROM data. Each of the memory elements 11 is provided to each of the word lines 30 and can store respective data whether the memory cell on the corresponding word line 30 is a ROM or a RAM. Each memory element 11 has a transistor with a controlled threshold voltage. In accordance with the value of the threshold voltage, memory cells on a word line 30 corresponding to each memory element 11 are defined to be ROM cells or RAM cells. Alternatively, each memory element 11 may include a transistor having a contact hole between, for example, a source (diffusion) of the transistor and a ground potential wiring. In accordance with a presence of the contact hole, memory cells on a word line 30 corresponding to each memory element 11 are defined to be ROM cells or RAM cells.

In order to simplify the above description, the state where the transistor has a high threshold voltage or the contact hole does not exist is herein referred to as the "open state", and the condition where the transistor has a low threshold voltage or the contact hole exists is referred to as the "short state".

When a row address corresponds to a line of ROM cells, the memory element 11 associated with the selected line of the ROM cells is set in the open state. When a row address corresponds to a line of RAM cells, the memory element 11 associated with the selected line of the RAM cells is set in the short state. The set is conducted by writing data through a photo-mask in the same manner as in writing data in a ROM cell.

The ROM/RAM decision element 12 comprises a node 100 connected to the plurality of the memory elements 11, a pull-up element 101 for pulling up the potential of the node 100 to a predetermined value and a two-stage inverter for generating an output 102 based upon the potential of the node 100. The ROM/RAM decision element 12 reads out data stored in the memory element 11, which is then output to the control element 13. When the potential of the word line 30 selected by the row address is raised up, the potential of the node 100 is varied depending upon whether the memory element 11 is in the open state or the short state. More specifically, when the memory element 11 corresponding to the designated row address is in the open state, the potential of the node 100 is kept at the high level by the pull-up element 101, resulting in activating the output 102 of the ROM/RAM decision element 12. When the memory element 11 corresponding to the designated row address is in the short state, the potential of the node 100 is pulled down to the low level, resulting in deactivating the output 102 of the ROM/RAM decision element 12.

The control element 13 comprises an AND circuit and an inverter connected in series. It receives an output 48 from the redundant ROM column decoder 203 and the output 102 from the ROM/RAM decision element 12. When both of these outputs are at the high level, the control element 13 activates an output signal (a select signal) 103 so as to indicates selection of the redundant ROM bit line pairs 247. The output of the redundant ROM column decoder 203 is at the high level when a defective line is selected. The output 102 of the ROM/RAM decision element 12 is at the high level when a ROM on the defective line is designated. Therefore, the output 48 from the redundant ROM column decoder 203 and the output 102 of the ROM/RAM decision element 12 are both at the high level when a ROM cell on the defective line is designated. In this manner, the control element 13 outputs a signal indicating selection of the redundant ROM bit line pair 247 when the address of the ROM on the defective line to be replaced with the redundant ROM bit line pair 247 is designated by a first address signal (a column selecting signal). Alternatively, the control element 13 outputs a signal indicating non-selection of the redundant ROM bit line pair 247 when the address of the RAM on the defective line to be replaced with the redundant ROM bit line pair 247 is designated by the first address signal and the second address signal.

The output signal 103 of the control element 13 is input to a control terminal of the redundant ROM bit line readout circuit 205. An inverted signal of the output signal 103 generated by inverting the output signal 103 by using an inverter is input to a control terminal of the data line readout circuit 5. The redundant ROM bit line readout circuit 205 and the data line readout circuit 5 amplify the potential differences in the data input terminals and transfer the amplified data to the output circuit 4 only when the potentials on the respective control terminals are at the high level. Therefore, either the redundant ROM bit line readout circuit 205 or the data line readout circuit 5 is operated in accordance with the output signal 103, thereby transferring the data either on the redundant ROM bit line pair 247 or on the data line 6 to the output circuit 4.

In this manner, according to Example 1 of the present invention, when an address of a ROM cell on a defective line is designated by row and column address signals, the corresponding row address on the redundant ROM bit line pair 247 is selected and its data is transferred to the output circuit 4. When an address of a RAM cell on a defective line is designated by row and column address signals, none of the addresses on the redundant ROM bit line pair 247 is selected and data is not sent to the output circuit 4. Thus, a butting of the addresses is prevented.

In each of Examples 2 through 8 described below, a semiconductor memory device having either a ROM redundant or a RAM redundant is shown as an example. In Example 9, a semiconductor memory device having both a ROM redundant and a RAM redundant for preventing the butting is described.

EXAMPLE 2

Figure 2:
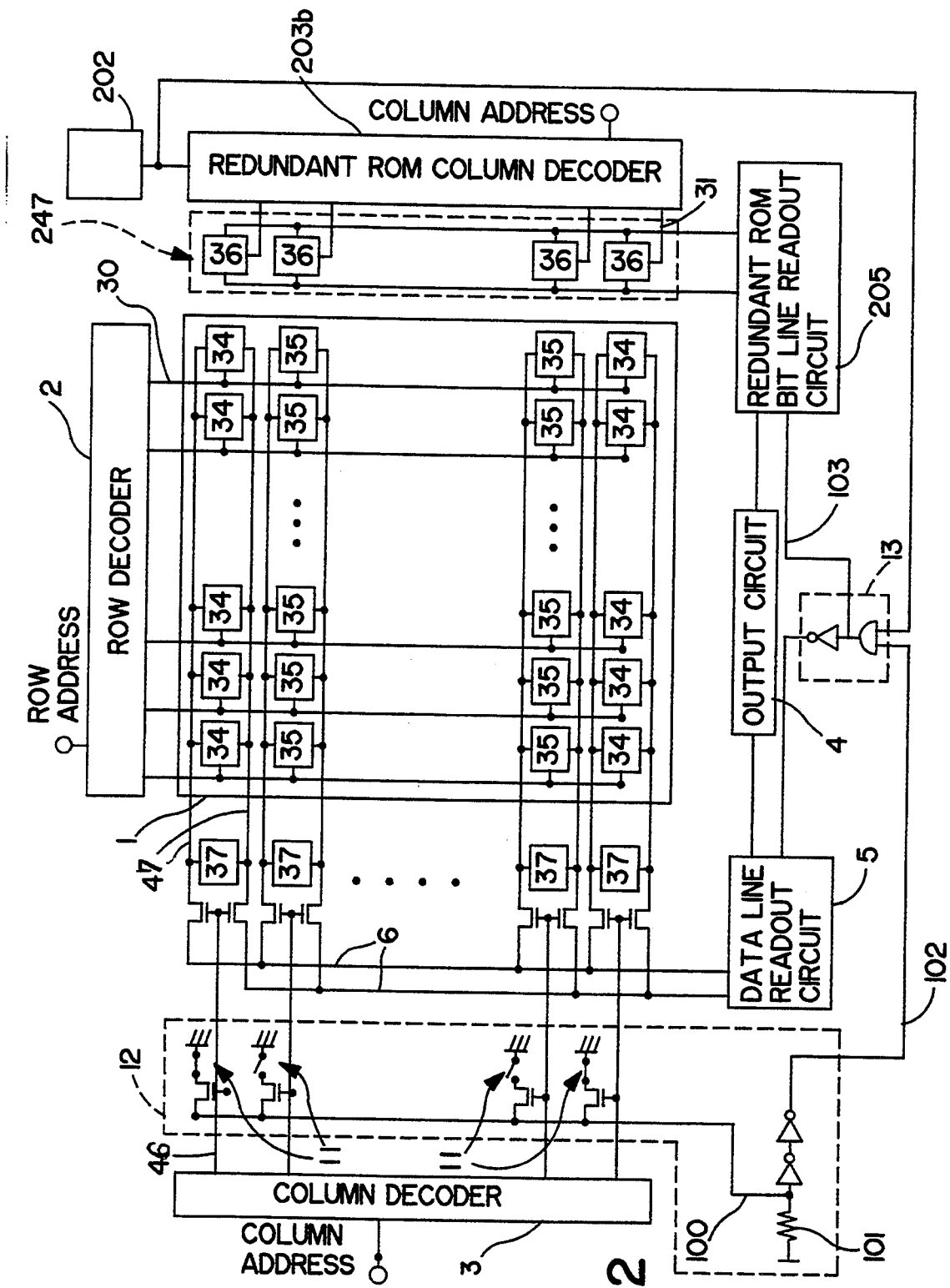
FIG. 2 shows a configuration for a semiconductor memory device according to Example 2 of the present invention.

Example 2 will now be described referring to FIG. 2. Like reference numerals are used throughout to refer to like elements in Example 1.

In this example, the RAM cells 34 and the ROM cells 35 are both present on a line parallel to the word lines 30 (a row line). Example 2 is different from Example 1 mainly in that the plurality of the memory elements 11 are provided to the respective bit line pairs 47 not to the respective word lines 30. Each of the memory elements 11 stores the data whether each column address on the word line 30 is a RAM or a ROM in the earlier step (the wafer process) in the same manner as writing data in a ROM. Similarly to the memory element of Example 1, the memory element 11 of this example also has an electrical element which is either in the open state or the short state. Each address is determined to be a ROM or a RAM in accordance with whether the element is in the open state or the short state.

Figure 11A:
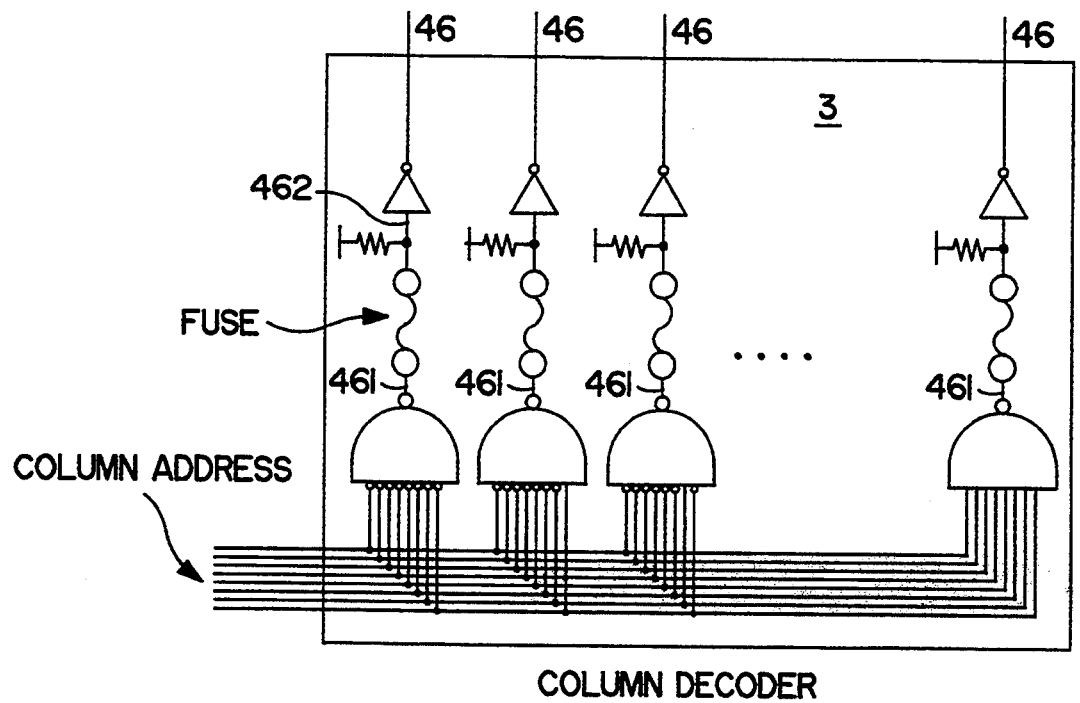
FIGS. 11a and 11b show a configuration for a column decoder and a row decoder, respectively.
Figure 11B:
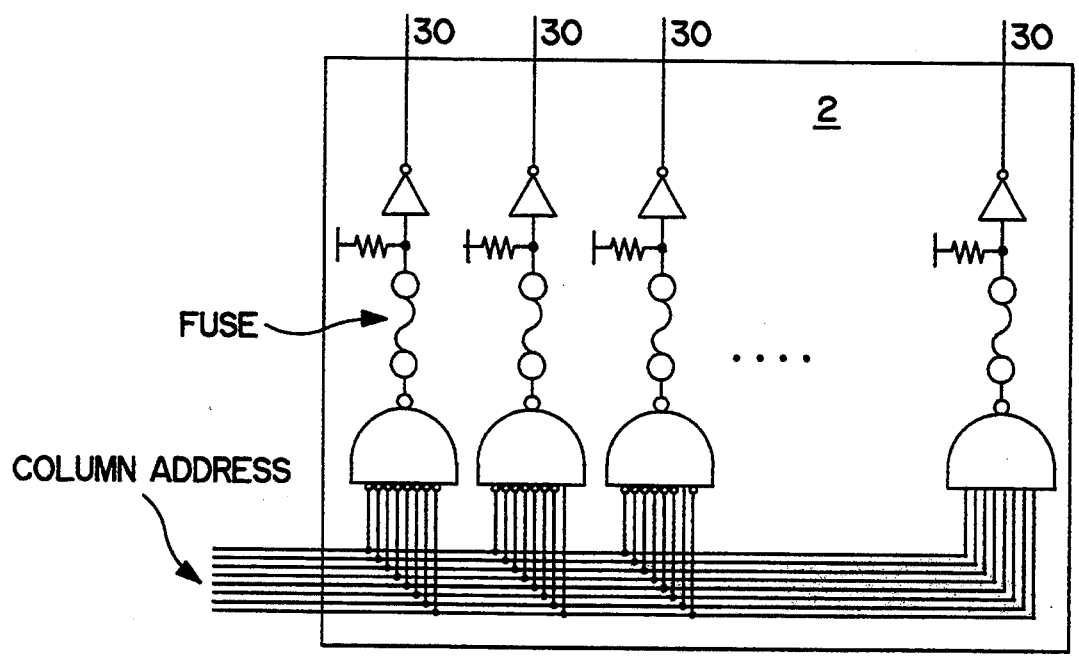

In this example, a defective word line 30 is redundantly recovered. The defective word line 30 is replaced with the redundant ROM bit line pair 247. A redundant ROM bit line pair corresponds to one row. The defective word line is deactivated by melting a fuse in the circuit in the row decoder 2 as shown in FIG. 11b corresponding to the defective address by using a laser trimming.

The semiconductor memory device according to this example has, as that of Example 1, the memory element 11 (the first means), a ROM/RAM decision element 12 (the second means) for reading data in the memory element 11 and the control element 13 (the third means). The ROM/RAM decision element 12 of this example reads out data whether an address on the bit line pair 47 selected by the column selecting signal line 46 indicates the locations of a ROM cell or a RAM cell from the corresponding memory element 11. More specifically, the ROM/RAM decision element 12 comprises the node 100 connected to the memory elements 11, the pull-up element 101 for pulling up the potential of the node 100 to a predetermined value and the two-stage inverter for generating the output 102 based on the potential of the node 100.

The semiconductor memory device of this example further has a redundant ROM column decoder 203b and a redundant ROM row decoder 202. The redundant ROM column decoder 203b receives a column address signal and outputs a redundant ROM column selecting signal 31.

According to this example, when the column selecting signal line 46 is activated in response to a column address signal, the potential of the node 100 in the ROM/RAM decision element 12 is varied depending upon whether the corresponding memory element 11 is in the open state or in the short state. More specifically, when the memory element 11 corresponding to the designated column address is in the open state, the potential of the node 100 is kept at the high level by the pull-up element 101, resulting in activating the output 102 of the ROM/RAM decision element 12. On the contrary, when the memory element 11 corresponding to the designated column address is in the short state, the potential of the node 100 is pulled down to the low level, resulting in deactivating the output 102 of the ROM/RAM decision element 12.

The control element 13 receives an output from the redundant ROM row decoder 202 and the output 102 from the ROM/RAM decision element 12. When these outputs are both in the high level, the control element 13 activates an output signal 103 so as to indicate selection of the redundant ROM bit line pair 247. The output of the redundant ROM row decoder 202 is activated when a defective row line is selected. The output 102 of the ROM/RAM decision element 12 is activated when a ROM on the defective row line is designated. Therefore, both the output from the redundant ROM row decoder 202 and the output 102 from the ROM/RAM decision element 12 are activated when a ROM on the defective row line is designated. In this manner, the control element 13 outputs a signal indicating selection of the redundant ROM bit line pair 247 when the address of a ROM on the defective row line to be replaced with the redundant ROM bit line pair 247 is designated by a first address signal (a column selecting signal) and a second address signal (a row selecting signal). The control element 13 outputs a signal indicating non-selection of the redundant ROM bit line pair 247 when the address of a ROM on the defective row line to be replaced with the redundant ROM bit line pair 247 is designated by a first address signal (a column selecting signal) and a second address signal (a row selecting signal).

As described above, according to the present example, when row and column address signals designate an address of a ROM cell on a defective line, the output signal 103 of the control element 13 is activated, and therefore, the redundant ROM bit line readout circuit 205 is brought into operation. Thus, data on the redundant ROM bit line pair 247 is read out to the output circuit 4. At this point, the data line readout circuit 5 does not work. When row and column address signals designate an address of a RAM cell on a defective line, the output 103 of the control element 13 is deactivated, and therefore, the redundant ROM bit line readout circuit 205 does not work. Thus, data on the redundant ROM bit line pair 247 is not read out in the output circuit 4.

EXAMPLE 3

Figure 3:
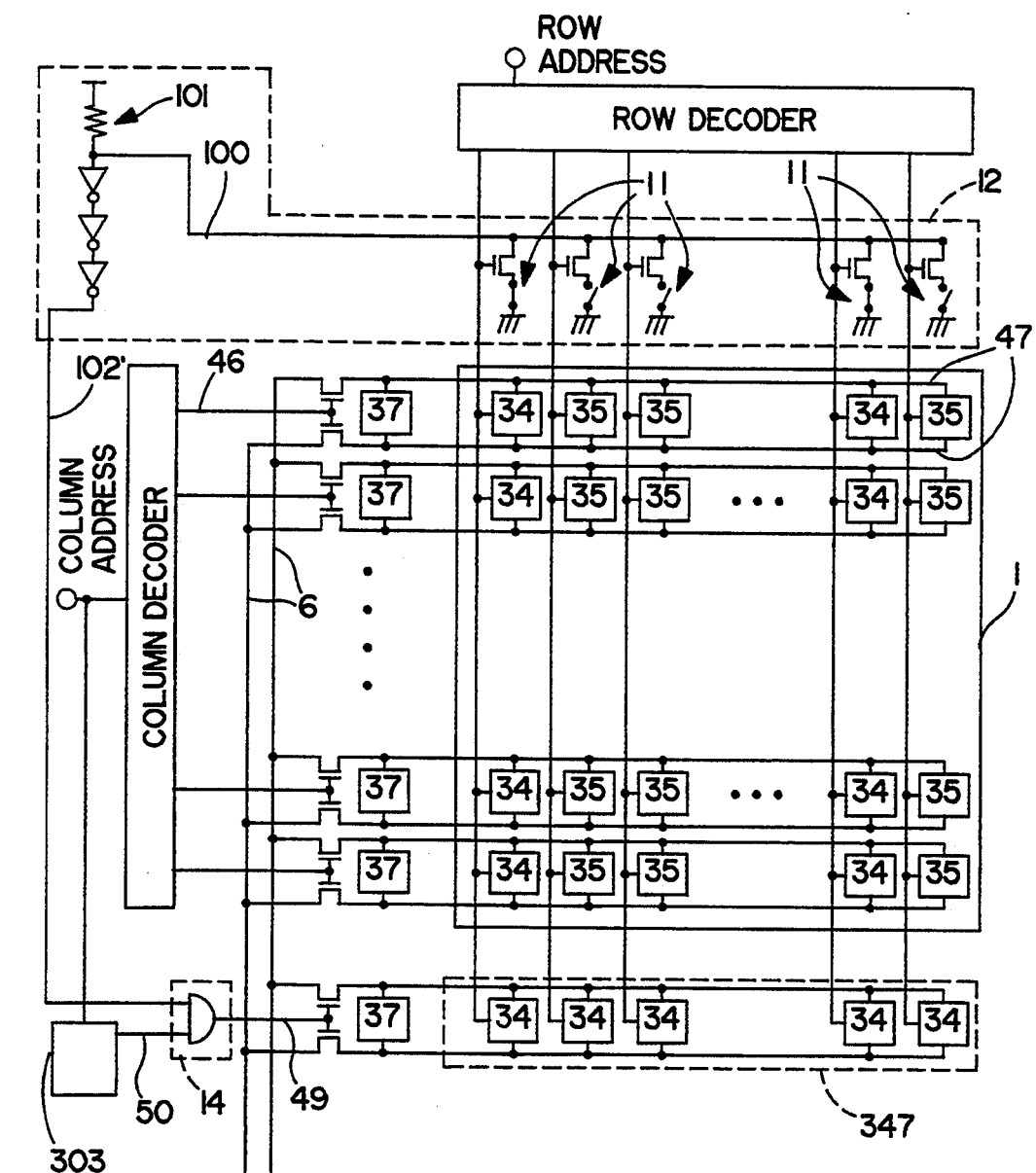
FIG. 3 shows a configuration for a semiconductor memory device according to Example 3 of the present invention.

Example 3 of the present invention will now be described referring to FIG. 3. The semiconductor memory device of this example has a redundant RAM bit line pair 347, the memory element 11 and the ROM/RAM decision element 12 similar to those of Example 1, and a second control element 14.

The memory element 11 of this example has a similar configuration to that of the memory element 11 in Example 1. The ROM/RAM decision element 12 of this example has a three-stage inverter, while that of Example 1 has a two-stage inverter. Because of the increased number of the stages of the inverter, an output 102' of the ROM/RAM decision element 12 is one obtained by inverting the output 102 of the ROM/RAM decision element 12 of Example 1. In this manner, the output 102' of the ROM/RAM decision element 12 of this example is the inverse of the output 102 of Example 1 because a RAM is redundantly recovered in this example while a ROM is redundantly recovered in Example 1.

As a result, when a row address signal designates a RAM, the output 102' of the ROM/RAM decision element 12 is activated. The second control element 14 (a fourth means) is an AND circuit. The second control element 14 receives the output 102' from the ROM/RAM decision element 12 and an output 50 from a redundant RAM column decoder 303. Only when both of these outputs are at the high level, the redundant RAM column selecting signal 49 is activated. At this point, a column selecting signal 46 from a column decoder 3 to a defective column line can not be activated because the corresponding fuses as shown in FIG. 11a are melted.

In this manner, according to Example 3, when row and column address signals designate an address of a RAM on a defective line, the redundant RAM bit line pair 347 is selected and connected to the data line 6, resulting in transferring the data to the output circuit 4. When row and column address signals designate an address of a ROM on a defective line, the redundant RAM bit line pair 347 is not selected and the data is not transferred to the output circuit 4.

EXAMPLE 4

Figure 4:
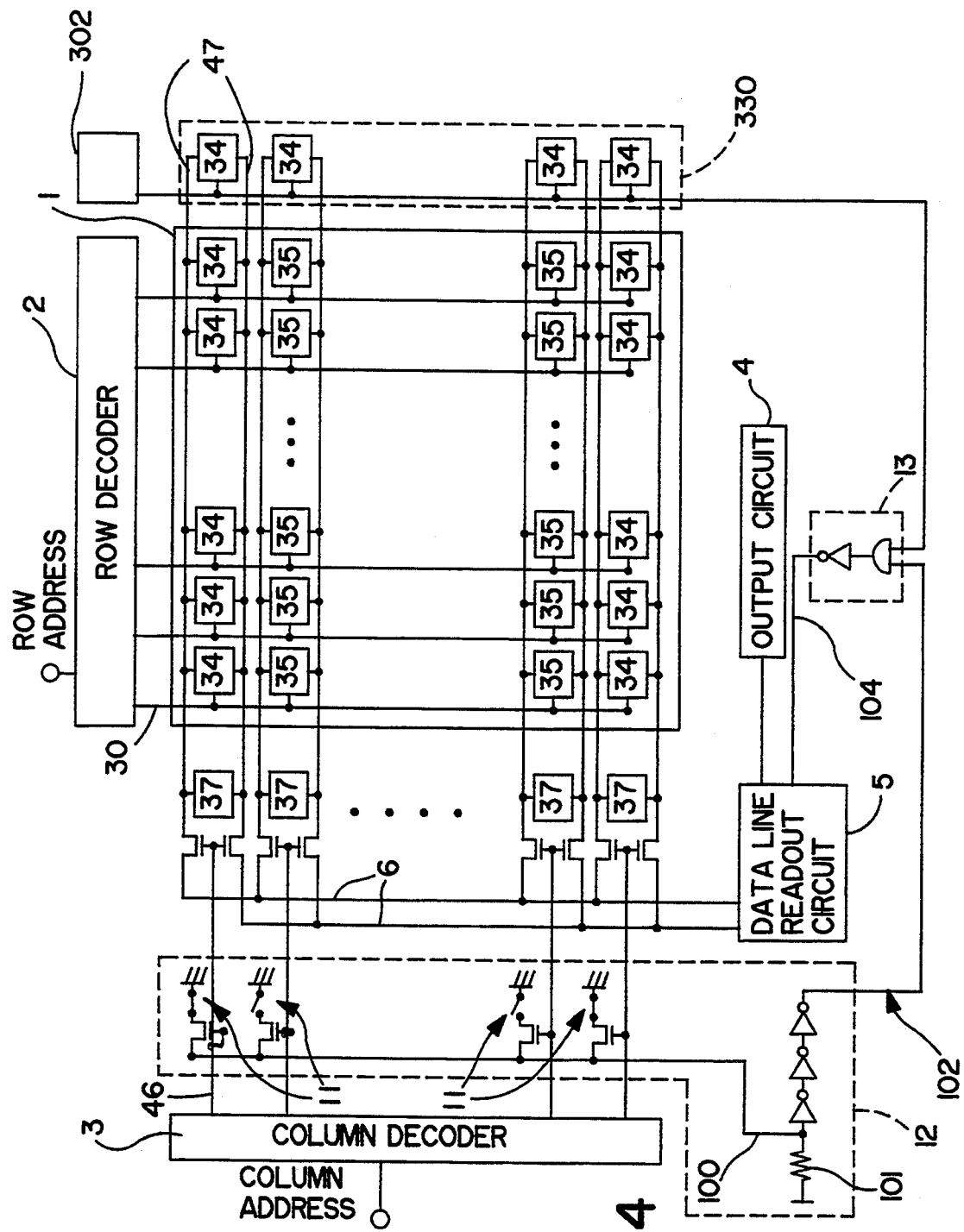
FIG. 4 shows a configuration for a semiconductor memory device according to Example 4 of the present invention.

Example 4 will now be described referring to FIG. 4. In the semiconductor memory device of this example, the ROM cells 35 and the RAM cells 34 are both present on a line parallel to the word lines 30 similarly to Example 2. A major difference between this example and Example 2 is that a ROM is redundantly recovered in Example 2 while a RAM is redundantly recovered in this example.

The semiconductor memory device of this example also has the memory element 11, the ROM/RAM decision element 12 and the control element 13 and further includes a redundant RAM word line 330. According to Example 4, when row and column address signals designate an address of a ROM on a defective line, an output 102 of the ROM/RAM decision element 12 is deactivated. Each of the RAM cells 34 on the redundant RAM word line 330 is connected to the same bit line pair 47 as that used in the memory cell array 1, and is brought into operation by using the sense amplifier 37, the data line 6 and the data line readout circuit 5 which are the same as those used in the memory cell array 1. A defective word line is deactivated by melting a fuse corresponding to a defective address in a row decoder 2 as shown in FIG. 11b by using a laser trimming. According to this example, only when an address of a ROM on a defective word line is designated, an output 104 from the control element 13 is deactivated. At this point, the data line readout circuit 5 does not work and data on the data line 6 is not transferred to the output circuit 4.

In this manner, according to Example 4, when row and column address signals designate an address of a RAM on a defective line, the data on the redundant RAM word line 330 is read out to the output circuit 4. When row and column address signals designate an address of a ROM on a defective line, the data on the redundant RAM word line 330 is not read out to the output circuit 4.

EXAMPLE 5

Example 5 will now be described referring to FIG. 5. In the semiconductor memory device according to this example, the ROM cells 35 and the RAM cells 34 are both present on a line parallel to the bit line pairs 47 similarly to that of Example 3. Major differences between this example and Example 3 are in that a ROM is redundantly recovered in this example while a RAM is redundantly recovered in Example 3; and that data whether a cell is a ROM or a RAM is memorized in the later step in the same manner as in the treatment for a redundant replacement in this example and in the earlier step in the same manner as in writing the ROM data in Example 3.

Figure 12:
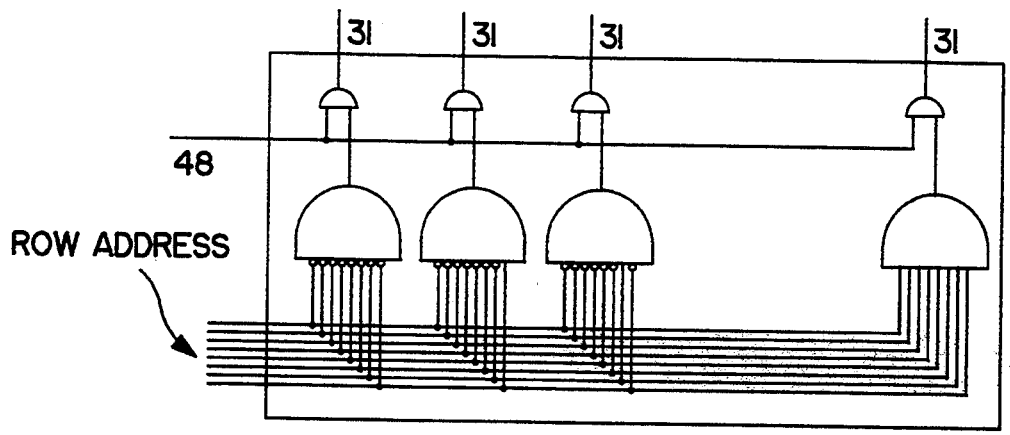
FIG. 12 shows a configuration for another row decoder.
Figure 13:
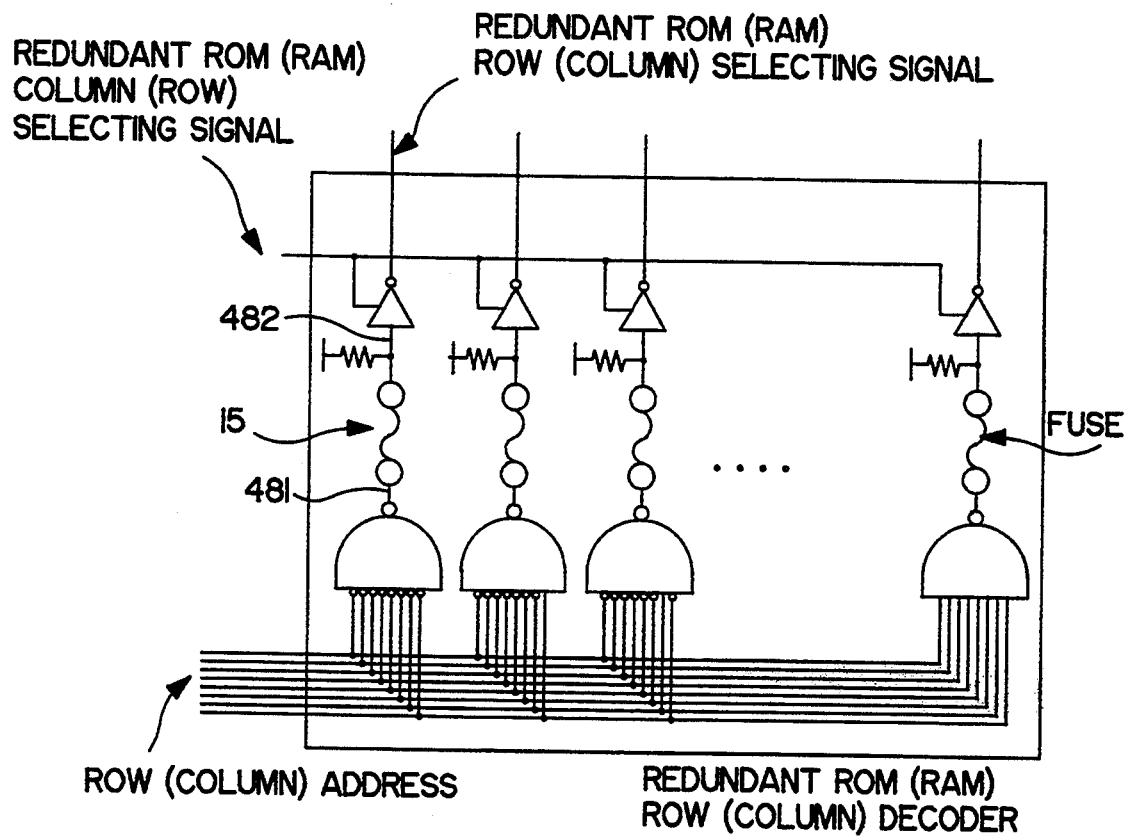
FIG. 13 shows a configuration for a redundant row (column) RAM (ROM) decoder.

A redundant ROM row decoder 202a of this example has a different configuration from that of the redundant ROM row decoder shown in FIG. 12. FIG. 13 exemplifies the configuration for the redundant ROM row decoder 202a. The redundant ROM row decoder 202a can be used also as a redundant ROM (RAM) column decoder or a redundant ROM (RAM) row decoder. In this example, the decoder as shown in FIG. 13 is used as the redundant ROM row decoder 202a.

As shown in FIG. 13, the redundant ROM row decoder 202a comprises a plurality of fuses (a fifth means)

which are programmable by using a laser trimming in the later process after the wafer test. The fuses corresponding to a row address of a ROM on a defective bit line pair are not melted, and those corresponding to the row address of a RAM on the defective bit line pair are melted. In the address corresponding to the melted fuses, a redundant ROM row selecting signal 31 can not be activated. Therefore, in a case where a defective address is designated, if a ROM is designated by a row address, the corresponding redundant ROM column selecting signal 31 is activated. When a RAM is designated, all the redundant column selecting signals are deactivated.

The semiconductor memory device according to Example 5 further has a ROM/RAM decision element 16 (a sixth means) having a similar configuration to that of the ROM/RAM decision element 12 of Example 1. The ROM/RAM decision element 16 is a wired-OR circuit. The ROM/RAM decision element 16 comprises a transistor in which one of the source or the drain is grounded and in which the gate is opened or closed in accordance with each of the redundant ROM row selecting signals 31, a node 150 commonly connected to the other of the source or the drain of each of the transistors, a pull-up element 151 for pulling up the potential of the node 150 to a predetermined value, and a three-stage inverter for generating an output 152 based on the potential of the node 150.

The ROM/RAM decision element 16 transfers the output 152 to the control element 13 depending upon the program in the redundant ROM row decoder 202a. When the potential of any of the redundant ROM row selecting signals 31 is activated, the node 150 is deactivated. When the potential of all the redundant ROM row selecting signals 31 are at the low level, the output 152 is deactivated since the node 150 is pulled up and kept at the high level.

The control element 13 receives an output 48 from the redundant ROM column decoder 203 and the output 152 from the ROM/RAM decision element 16. When both the outputs are at the high level, the control element 13 activates a signal 103 so as to bring a redundant ROM bit line readout circuit 205 into operation. The output 48 from the redundant ROM column decoder 203 is activated when a defective line is selected. The output 152 from the ROM/RAM decision element 16 is activated when a ROM on a defective line is designated. Therefore, both the output 48 of the redundant ROM column decoder 203 and the output 152 of the ROM/RAM decision element 16 are activated when a ROM on a defective line is designated. In this manner, when the address of a ROM on a defective line to be replaced with the redundant ROM bit line pair 247 is designated by a first address signal (a column selecting signal) and a second address signal (a row selecting signal), the control means 13 outputs a signal indicating selection of the redundant ROM bit line pair 247. When an address of a RAM on a defective line to be replaced with the redundant ROM bit line pair 247 is designated by a first address signal and a second address signal, the control element 13 outputs a signal indicating non-selection of the redundant ROM bit line pair 247. The output signal 103 from the control element 13 is input to a control terminal of the redundant ROM bit line readout circuit 205. An inverted signal formed by inverting the output signal 103 by an inverter is input to the control terminal of the data line readout circuit 5. The redundant ROM bit line readout circuit 205 and the data line readout circuit 5 amplify the potential difference in the data input terminals only when the control terminals are at the high level, and transfer the amplified data to the output circuit 4. Therefore, either the redundant ROM bit line readout circuit 205 or the data line readout circuit 5 is brought into operation in accordance with the output signal 103, thereby transferring data either on the redundant ROM bit line pair 247 or on the data line 6 to the output circuit 4.

EXAMPLE 6

Figure 6:
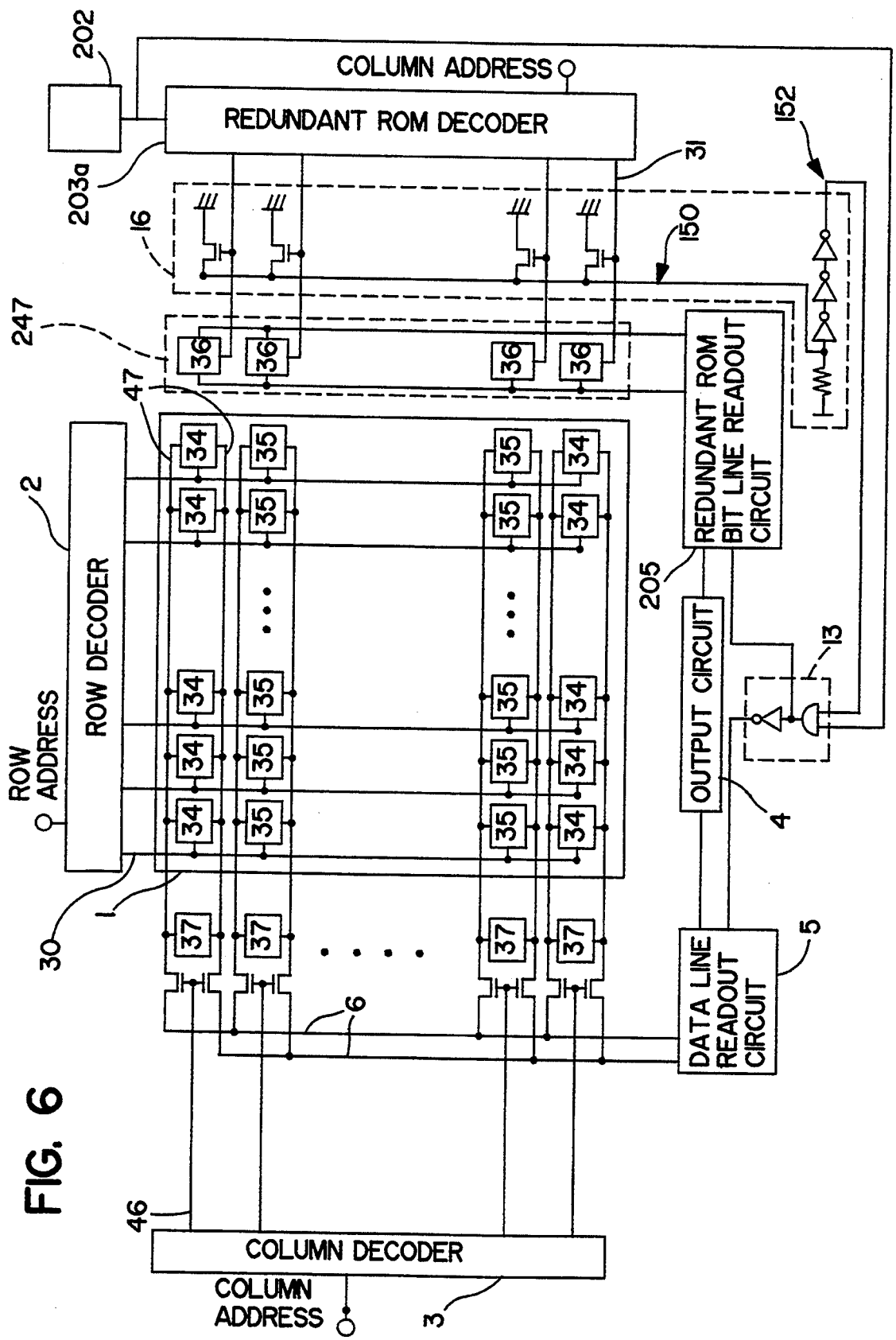
FIG. 6 shows a configuration for a semiconductor memory device according to Example 6 of the present invention.

Example 6 will now be described referring to FIG. 6. In the semiconductor memory device of this example, the ROM cells 35 and the RAM cells 34 are both present on a line parallel to the word lines 30. The present example is different from Example 5 where the ROM cells 35 and the RAM cells 34 are both present on the line parallel to the bit line pairs 47. The configuration for the semiconductor memory device of this example is similar to that of the semiconductor memory device according to Example 2. A major difference between Example 2 and Example 6 is in a configuration for a means for storing data whether a cell is a ROM or a RAM provided to every bit line pair 47.

The semiconductor memory device of this example has a redundant ROM column decoder 203a having the configuration shown in FIG. 13. Similarly to the redundant ROM row decoder 202a of Example 5, the redundant ROM column decoder 203a has fuses which are programmable in the later process after the wafer test by using a laser trimming. The fuses corresponding to the row address of a ROM on a defective bit line are not melted, and those corresponding to a row address of a RAM on a defective bit line are melted. A redundant ROM row selecting signal 31 can not be activated in a row address corresponding to the melted fuses. Therefore, in a case where a defective address is designated, when a ROM is designated by a row address, the corresponding redundant ROM row selecting signal 31 is activated. When a RAM is designated, all the redundant ROM row selecting signals 31 are deactivated.

The semiconductor memory device of Example 6 has a ROM/RAM decision element 16 similar to that of Example 5. When the potential of any of the redundant ROM row selecting signals 31 is activated, an output 152 of the ROM/RAM decision element 16 is activated. When the potential of all the redundant ROM row selecting signals 31 are deactivated, the output 152 is deactivated because the node 150 is pulled up and kept at the high level. The output 152 works similarly to the output 102 of the ROM/RAM decision element 12 of Example 2. The operations of the other elements are identical to those in the semiconductor memory device of Example 2.

EXAMPLE 7

Figure 7:
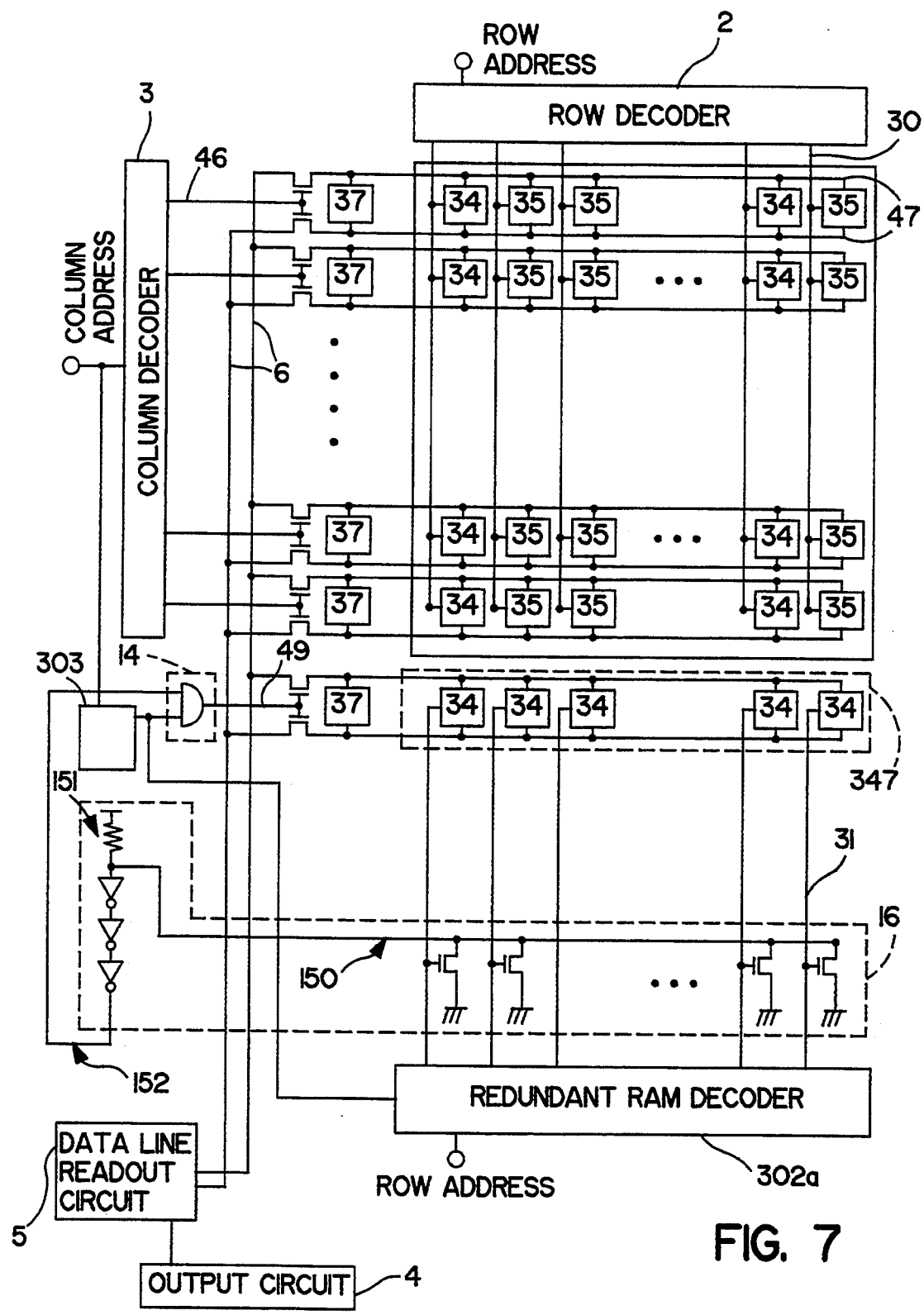
FIG. 7 shows a configuration for a semiconductor memory device according to Example 7 of the present invention.

Example 7 will now be described referring to FIG. 7. In the semiconductor memory device of this example, the ROM cells 35 and the RAM cells 34 are both present on a line parallel to the bit line pairs 47. The configuration for the semiconductor memory device is similar to that of Example 3.

This semiconductor memory device has a redundant RAM row decoder 302a having a configuration as shown in FIG. 13 and the redundant RAM bit line pair 347. In this example, a RAM is redundantly recovered. Fuses in the redundant RAM row decoder 302a corresponding to the row address of a RAM on a defective bit line pair are not melted, and those corresponding to a row address of a ROM are melted. Therefore, in a case where a defective address is designated, when a RAM is designated by a row address, the corresponding redundant RAM row selecting signal 31 is activated. When a ROM is designated, all the redundant RAM row selecting signals 31 are deactivated. When at least one of the redundant RAM row selecting signals 31 is activated, the node 150 is pulled down to the low level and the output 152 from the ROM/RAM decision element 16 is activated. When all the redundant RAM row selecting signals 31 are deactivated, the node 150 is pulled up and kept at the high level, and the output 152 from the ROM/RAM decision element 16 is activated. The output 152 from the ROM/RAM decision element 16 works similarly to the output 102' from the ROM/RAM decision element 12 in Example 3. Specifically, the output 152 is input to the second control element 14 (an AND circuit) together with an output from a redundant RAM column decoder 303.

EXAMPLE 8

Figure 8:
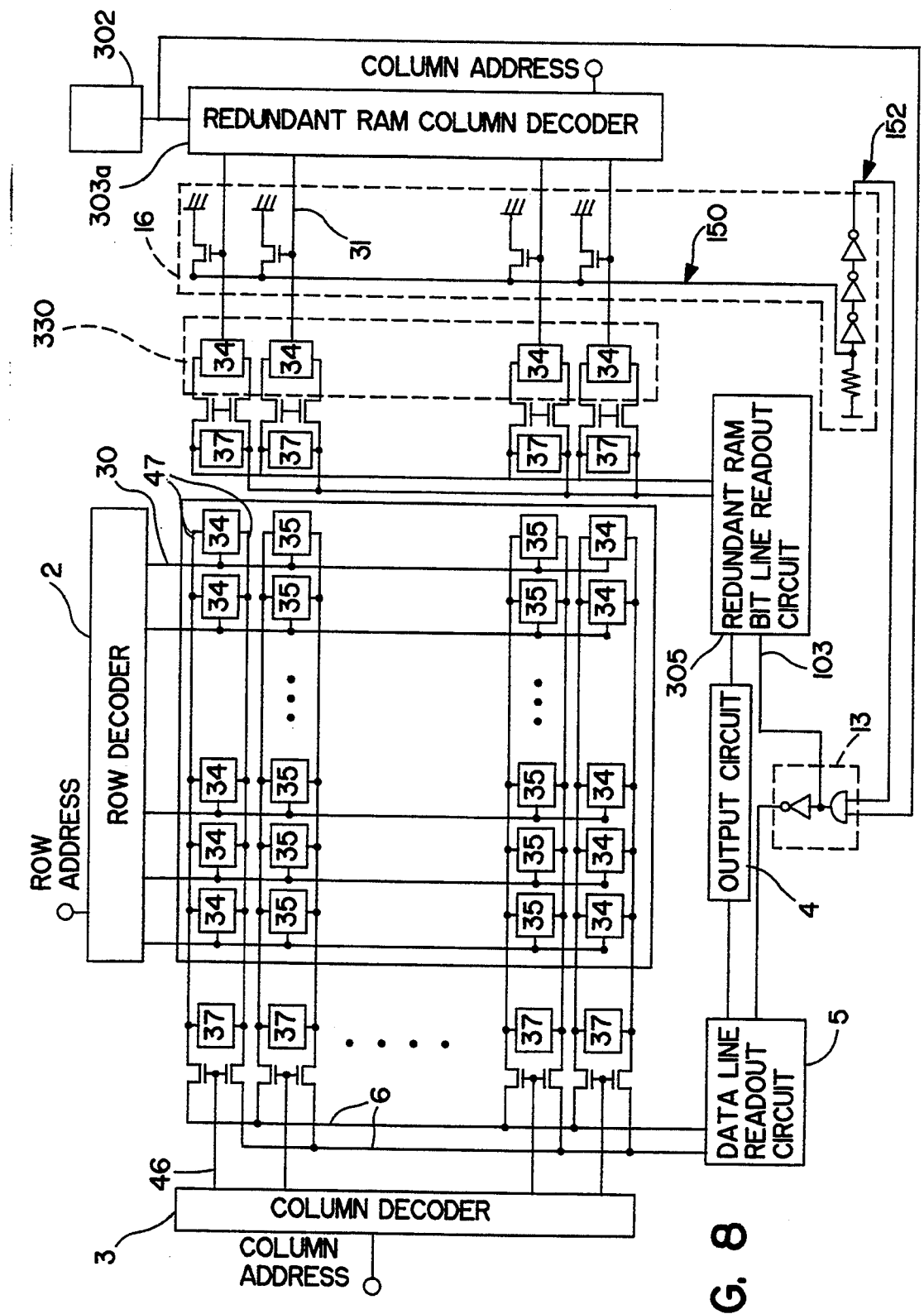
FIG. 8 shows a configuration for a semiconductor memory device according to Example 8 of the present invention.

Example 8 will now be described referring to FIG. 8.

The semiconductor memory device according to this example has a sense amplifier 37 which is different from that used for an ordinary memory cell, the data line 6 and a redundant RAM data line readout circuit 305 for the operations such as readout of a redundant RAM memory cell. The redundant RAM data line readout circuit 305 has the same configuration as that of the data line readout circuit 5 used in Example 1. Therefore, the operation of the redundant RAM word line 350 for reading the RAM memory cells 34 is identical to that for reading ordinary RAM memory cells. The semiconductor memory device of this example comprises a redundant RAM column decoder 303a with a configuration as shown in FIG. 13. In this example, RAMs are redundantly recovered. Fuses in the redundant RAM column decoder 303a corresponding to the row address of a RAM on a defective bit line pair are not melted and those corresponding to the row address of a ROM are melted. The operations of the redundant RAM column decoder 303a and the ROM/RAM decision element 16 are basically the same as those described in Example 6.

EXAMPLE 9

Figure 9:
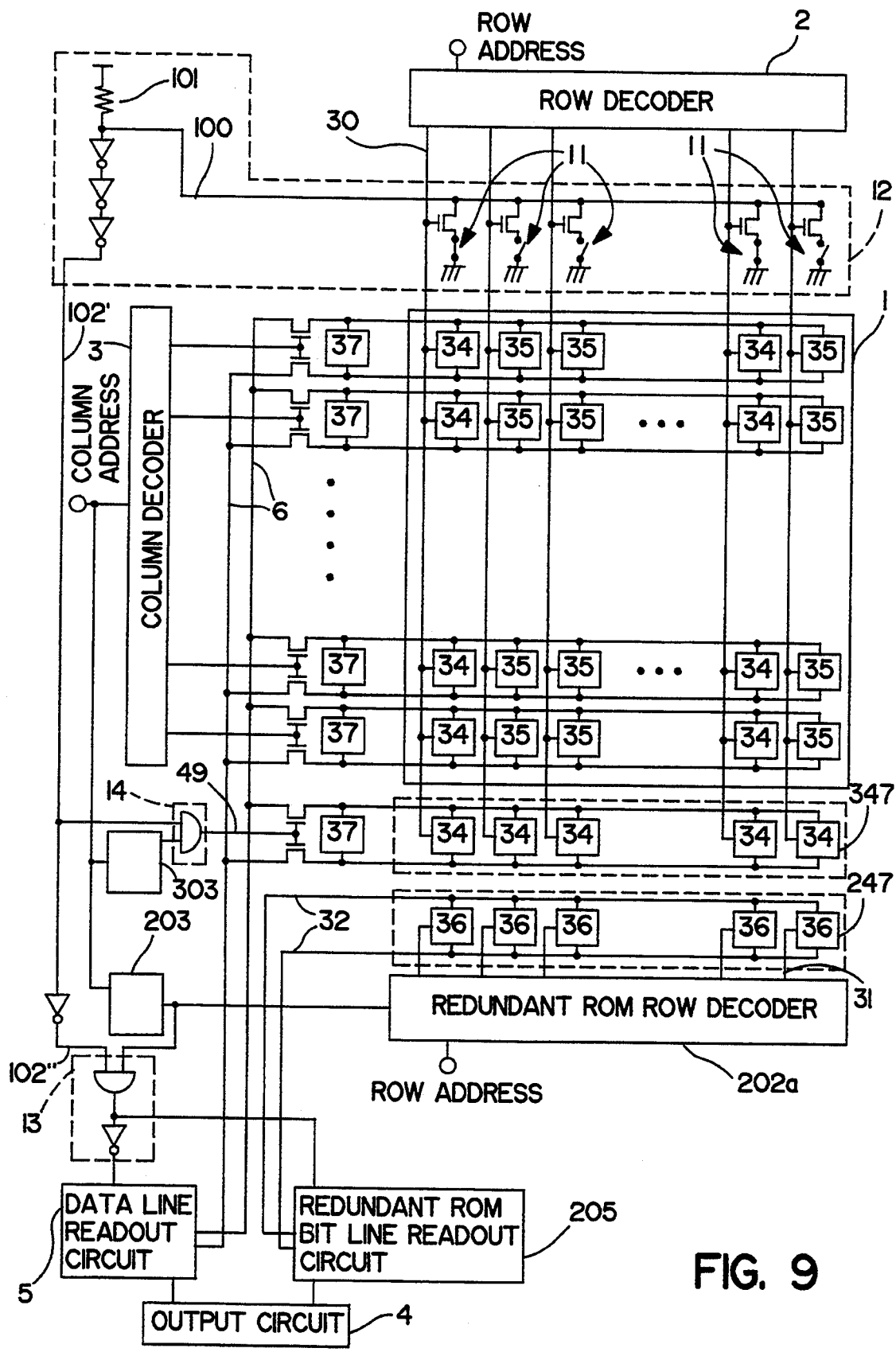
FIG. 9 shows a configuration for a semiconductor memory device according to Example 9 of the present invention.

Example 9 will now be described referring to FIG. 9.

The semiconductor memory device of this example has functions attained by combining Examples 3 and 5. This semiconductor memory device has a circuit similar to that in the semiconductor memory device according to Example 3 as a circuit for a redundant RAM. The output 102' of the ROM/RAM decision element 12 is the inverse of the output 152 of the ROM/RAM decision element 16 in Example 5. Therefore, in this example, the semiconductor memory device has a ROM/RAM decision element 12 alone.

The semiconductor memory device of this example has a circuit similar to that in Example 5 as a circuit for a redundant ROM. In this example, an inverted signal 102'' formed by inverting the output 102' of the ROM/RAM decision element 12 by an inverter is used instead of the output 152 of the ROM/RAM decision element 16 in Example 5.

The semiconductor memory device of this example has the memory element 11 for storing and setting data whether each address on a line designated by a second address signal (a row address signal) is a ROM or a RAM in the earlier step in the same manner as writing of the ROM data.

When the potential of a word line 30 selected by a row address is raised up, the potential of the node 100 is varied depending upon whether the memory element 11 corresponding to the row address is in the open state or the short state. More specifically, when the memory element 11 corresponding to the designated row address is in the open state, the potential of the node 100 is kept at the high level by the pull-up element 101. As a result, the output 102' of the ROM/RAM decision element 12 is deactivated. Namely, when a ROM is designated, the memory element 11 is set to the open state and when a RAM is designated, the memory element 11 is set to the short state.

When the memory element 11 is in the short state, the potential of the node 100 is pulled down to the low level. As a result, the output 102' of the ROM/RAM decision element 12 is activated.

Therefore, when the selected row address is a ROM, the output 102' of the ROM/RAM decision element 12 is deactivated, and when the selected row address is a RAM, the output 102' is activated.

The semiconductor memory device of this example further has a redundant RAM column decoder 303 which receives a first address signal (a column address signal) to detect the designation of a defective line, and the second control element (an AND circuit) 14. The second control element 14 receives an activated output 102' when the address of a RAM on a defective line is designated and a deactivated output 102' when the address of a ROM on a defective line is designated, depending upon the data stored in the memory element 11. The second control element 14 outputs a redundant RAM column selecting signal 49. The redundant RAM column selecting signal 49 is activated when row and column address signals designate a RAM on a defective line, and is deactivated when they designate a ROM.

In this manner, the redundant RAM bit line pair 347 is replaced with the defective line, and then connected to the data line 6 when row and column address signals designate an address of a RAM on the defective line. The redundant RAM bit line pair 347 is not connected to the data line 6 when row and column address signals designate the address of a ROM on the defective line.

In this example, the redundant ROM row decoder 202a includes fuses (the fifth means) in which whether each row address on a defective line to be replaced is a ROM or a RAM is programmed in the later step in the same manner as in the treatment for the redundant replacement. An example of a circuit in the redundant ROM row decoder 202a is shown in FIG. 13. When the memory cell on the row address on the defective line is a ROM, the corresponding fuse is not melted. When the memory cell on the row address on the defective line is a RAM, the fuse is melted. As shown in FIG. 13, in a case where the corresponding fuse in the decoder is not melted, when a row address decode signal 481 for decoding a row address is deactivated, a node 482 is pulled down, resulting in outputting a redundant ROM row selecting signal 31. When the fuse is melted, even if the row address decode signal 481 for decoding the row address is deactivated, the node 482 is not pulled down and kept at the high level. As a result, the redundant ROM row selecting signal 31 is not output.

In this manner, the redundant ROM row decoder 202a of this example outputs a redundant ROM row selecting signal 31 to the redundant ROM bit line pair 247 when row and column address signals designate the address of a ROM on a defective line, depending upon whether or not the fuse is melted. The redundant ROM row decoder 202a does not output an active redundant ROM row selecting signal 31 to the redundant ROM bit line 247 when row and column address signals designate the address of a RAM on a defective line. As a result, according to this example, after the redundant ROM bit line pair 247 is replaced with the defective bit line, a memory cell corresponding to the row address signal on the redundant ROM bit line pair 247 is selected when row and column address signals designate the address of a ROM on the defective line. When row and column address signals designate the address of a RAM on the defective line, none of the memory cells on the redundent ROM bit line pair 247 is selected.

In the semiconductor memory device of this example, switching between the data line readout circuit 5 and the redundant ROM bit line readout circuit 205 is conducted by the control element 13. When row and column address signals designate the address of a ROM on a defective line, an output from the control element 13 is activated, i.e., the control terminal of the redundant ROM bit line readout circuit 205 is activated, and the control terminal of the data line readout circuit 5 is deactivated. When row and column address signals designate the address of a ROM on a defective line, the output from the control element 13 is deactivated, i.e., the control terminal of the redundant ROM bit line readout circuit 205 is deactivated, and the control terminal of the data line readout circuit 5 is activated.

When the address of a ROM on a defective line is selected, data on the corresponding memory cell on the redundant ROM bit line pair 247 is transferred to the output circuit 4. When the address of a RAM on a defective line is selected, data on the corresponding memory cell on the redundant RAM bit line pair 347 is transferred to the output circuit 4.

Figure 10:
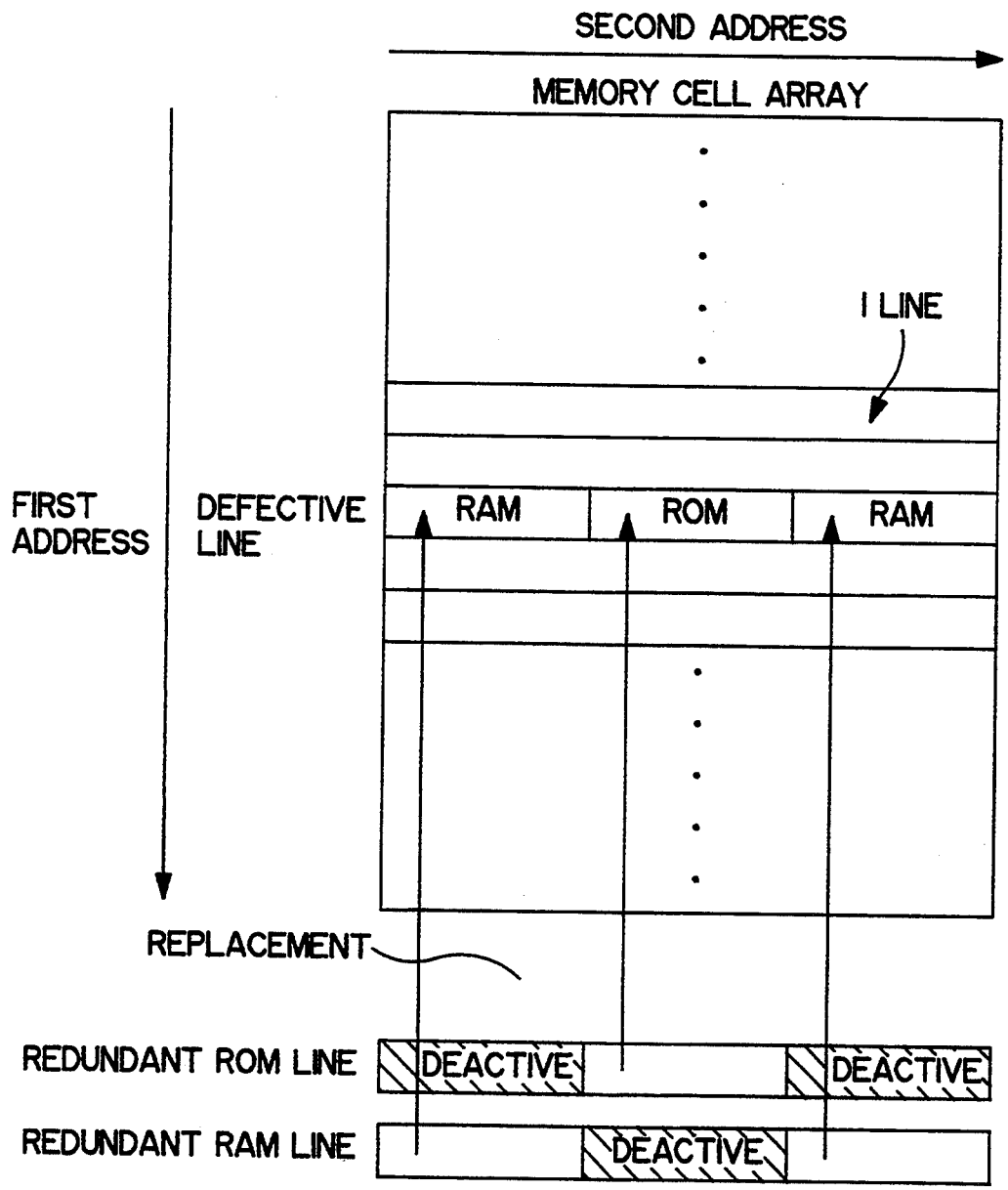
FIG. 10 illustrates an effect obtained in Example 9, schematically showing a redundant replacement in which a defective line including ROM cells and RAM cells is replaced with a redundant ROM line and a redundant RAM line.

As described above, in the semiconductor memory device of this example, a butting of a selected address on the redundant ROM bit line pair 247 and that on the redundant RAM bit line pair 347 both of which are replaced with one defective line is not caused. This will be described in detail referring to FIG. 10.

In a semiconductor memory device in which ROMs and RAMs are both present on one line and in which data is written in a ROM in the earlier step, it is preferable to provide both a redundant ROM line in which data can be replaced in the later step and a redundant RAM line. According to the present example, when a redundant ROM line and a redundant RAM line are replaced with a defective line, the corresponding address on the redundant ROM line is arranged on the corresponding address of a ROM on the defective line. A corresponding address of the redundant RAM line is arranged on the corresponding address of a RAM on the defective line. Therefore, when the defective line is selected by a first address signal, either the redundant ROM line or the redundant RAM line is selected, thereby preventing any butting of the addresses.

In Examples 1, 2, 5 and 6, ROMs are redundantly recovered, and in Examples 3, 4, 7 and 8, RAMs are redundantly recovered. Therefore, it is possible to redundantly recover both ROMs and RAMs by combining any of Examples 1, 2, 5 and 6 with any of Examples 3, 4, 7 and 8. Example 9 is a combination of Examples 3 and 5, in which ROMs and RAMs are both redundantly recovered.

In Examples 1, 2, 3 and 4, the data whether a cell is a ROM or a RAM is stored in the earlier step in the same manner as storing the ROM data. In Examples 5, 6, 7 and 8, the data whether a cell is a ROM or a RAM is stored in the later step in the same manner as the treatment for the redundant replacement.

In Examples 1, 3, 5 and 7, ROMs and RAMs are both present on a bit line pair. In Examples 2, 4, 6 and 8, ROMs and RAMs are both present on a word line.

As described above, according to the present invention, it is possible to redundantly recover a line where ROMs and RAMs are both present. Therefore, a semiconductor memory device having both ROMs and RAMs on one line can be produced with a high yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
a memory cell array in which memory cells are arranged on a plurality of row lines and column lines, wherein an address on the memory cell array is selected by a first address signal for designating one line among the plurality of lines and a second address signal for designating one address on the line designated by the first address signal, and at least one line of the plurality of lines having both ROM cells and RAM cells mixed;
a redundant ROM line as a redundant line for replacing a defective line among the plurality of lines; and
an address selecting means,
wherein the address selecting means selects an address on the redundant ROM line corresponding to the second address signal when an address of a ROM cell on the defective line is designated by the first and the second address signals, and does not select an address on the redundant ROM line corresponding to the second address signal when an address of a RAM cell on the defective line is designated by the first and the second address signals.

2. A semiconductor memory device according to claim 1 further comprising a memory means for memorizing a data, at the time of writing ROM data, whether each address designated by the second address signal is a ROM cell or a RAM cell.

3. A semiconductor memory device according to claim 2 further comprising:
a redundant ROM decoder for receiving the first address signal and detecting designation of the defective line, and
a control means for receiving an output of the redundant ROM decoder to output a signal indicating selection of the redundant ROM line when a ROM cell on the defective line is designated by the first and the second address signals and to output a signal indicating non-selection of the redundant ROM line when a RAM cell on the defective line is designated by the first and the second address signals, depending upon the data in the memory means.

4. A semiconductor memory device according to claim 2 further comprising a ROM/RAM decision means for receiving the second address signal to read out the data in the memory means regarding an address designated by the second address, thereby generating an output depending upon the data.

5. A semiconductor memory device according to claim 1 further comprising a program means for programming a program whether each address on the defective line is a ROM cell or a RAM cell when the defective line is replaced with the redundant line.

6. A semiconductor memory device according to claim 5 further comprising a decoder for receiving the second address signal, the decoder outputting a signal indicating selection of an address on the redundant ROM line corresponding to the second address signal when an address designated by the first and the second address signals is a ROM cell on the defective line, and not outputting a signal indicating selection of an address on the redundant ROM line corresponding to the second address signal when an address designated by the first and the second address signals is a RAM cell on the defective line, depending upon the program of the program means.

7. A semiconductor memory device according to claim 5 further comprising a ROM/RAM decision means for receiving the second address signal to read out the program in the program means regarding an address designated by the second address, thereby generating an, output depending upon the program.

8. A semiconductor memory device comprising:
a memory cell array in which memory cells are arranged on a plurality of row lines and column lines, wherein an address on the memory cell array is selected by a first address signal for designating one line among the plurality of lines and a second address signal for designating one address on the line designated by the first address signal, and at least one line of the plurality of lines having both ROM cells and RAM cells mixed;
a redundant RAM line as a redundant line for replacing a defective line among the plurality of lines; and
an address selecting means,
wherein the address selecting means selects an address on the redundant RAM line corresponding to the second address signal when an address of a RAM cell on the defective line is designated by the first and the second address signals, and does not select an address on the redundant RAM line corresponding to the second address signal when an address of a ROM cell on the defective line is designated by the first and the second address signals.

9. A semiconductor memory device according to claim 8 further comprising a memory means for memorizing a data, at the time of writing ROM data, whether each address designated by the second address signal is a ROM cell or a RAM cell.

10. A semiconductor memory device according to claim 9 further comprising:
a redundant RAM decoder for receiving the first address signal and detecting designation of the defective line, and
a control means for receiving an output from the redundant RAM decoder to output a signal indicating selection of the redundant RAM line when a RAM cell on the defective line is designated by the first and the second address signals and to output a signal indicating non-selection of the redundant RAM line when a ROM cell on the defective line is designated by the first and the second address signals, depending upon the data in the memory means.

11. A semiconductor memory device according to claim 9 further comprising a ROM/RAM decision means for receiving the second address signal to read out the data in the memory means regarding an address designated by the second address, thereby generating an output depending upon the data.

12. A semiconductor memory device according to claim 8 further comprising a program means for programming a program whether each address on the defective line is a ROM cell or a RAM cell when the defective line is replaced with the redundant line.

13. A semiconductor memory device according to claim 12 further comprising a decoder for receiving the second address signal, the decoder outputting a signal indicating selection of an address on the redundant RAM line corresponding to the second address signal when an address designated by the first and the second address signals is a RAM cell on the defective line, and not outputting a signal indicating selection of an address on the redundant RAM line corresponding to the second address signal when an address designated by the first and the second address signals is a ROM cell on the defective line, depending upon the program of the program means.

14. A semiconductor memory device according to claim 12 further comprising a ROM/RAM decision means for receiving the second address signal to read out the program in the program means regarding an address designated by the second address, thereby generating an output depending upon the program.

15. A semiconductor memory device comprising:
a memory cell array in which memory cells are arranged on a plurality of row lines and column lines, wherein an address on the memory cell array is selected by a first address signal for designating one line among the plurality of lines and a second address signal for designating one address on the line designated by the first address signal, and at least one line of the plurality of lines having both ROM cells and RAM cells mixed;
a redundant ROM line and a redundant RAM line as a redundant line for replacing a defective line among the plurality of lines; and
an address selecting means,
wherein the address selecting means selects an address on the redundant ROM line corresponding to the second address signal when an address of a ROM cell on the defective line is designated by the first and the second address signals, and selects an address on the redundant RAM line corresponding to the second address signal when an address of a RAM cell on the defective line is designated by the first and the second address signals.

16. A semiconductor memory device according to claim 15 further comprising a memory means for memorizing a data, at the time of writing ROM data, whether each address designated by the second address signal is a ROM cell or a RAM cell.

17. A semiconductor memory device according to claim 16 further comprising:
a redundant ROM decoder for receiving the first address signal and detecting designation of the defective line, and
a control means for receiving an output of the redundant ROM decoder to output a signal indicating selection of the redundant ROM line when a ROM cell on the defective line is designated by the first and the second address signals and to output a signal indicating nonselection of the redundant ROM line when a RAM cell on the defective line is designated by the first and the second address signals, depending upon the data in the memory means.

18. A semiconductor memory device according to claim 16 further comprising:
a redundant RAM decoder for receiving the first address signal and detecting designation of the defective line, and
a control means for receiving an output from the redundant RAM decoder to output a signal indicating selection of the redundant RAM line when a RAM cell on the defective line is designated by the first and the second address signals and to output a signal indicating nonselection of the redundant RAM line when a ROM cell on the defective line is designated by the first and the second address signals, depending upon the data in the memory means.

19. A semiconductor memory device according to claim 16 further comprising a ROM/RAM decision means for receiving the second address signal to read out the data in the memory means regarding an address designated by the second address, thereby generating an output depending upon the data.

20. A semiconductor memory device according to claim 15 further comprising a program means for programming a program whether each address on the defective line is a ROM cell or a RAM cell when the defective line is replaced with the redundant line.

21. A semiconductor memory device according to claim 20 further comprising a decoder for receiving the second address signal, the decoder outputting a signal indicating selection of an address on the redundant ROM line corresponding to the second address signal when an address designated by the first and the second address signals is a ROM cell on the defective line, and not outputting a signal indicating selection of an address on the redundant ROM line corresponding to the second address signal when an address designated by the first and the second address signals is a RAM cell on the defective line, depending upon the program of the program means.

22. A semiconductor memory device according to claim 20 further comprising a decoder for receiving the second address signal, the decoder outputting a signal indicating selection of an address on the redundant RAM line corresponding to the second address signal when an address designated by the first and the second address signals is a RAM cell on the defective line, and not outputting a signal indicating selection of an address on the redundant RAM line corresponding to the second address signal when an address designated by the first and the second address signals is a ROM cell on the defective line, depending upon the program of the program means.

23. A semiconductor memory device according to claim 20 further comprising a ROM/RAM decision means for receiving the second address signal to read out the program in the program means regarding an address designated by the second address, thereby generating an output depending upon the program.

* * * * *

UNITED STATES PATENT AND TRADEMARK OFFICE
CERTIFICATE OF CORRECTION

PATENT NO. : 5,388,076
DATED : February 7, 1995
INVENTOR(S) : Makoto Ihara

It is certified that error appears in the above-indentified patent and that said Letters Patent is hereby corrected as shown below:

Column 19:

Claim 7, line 26: Is: "an, output"
                          should be: --an output--.

<u>In the Drawings:</u>

Figure 5:
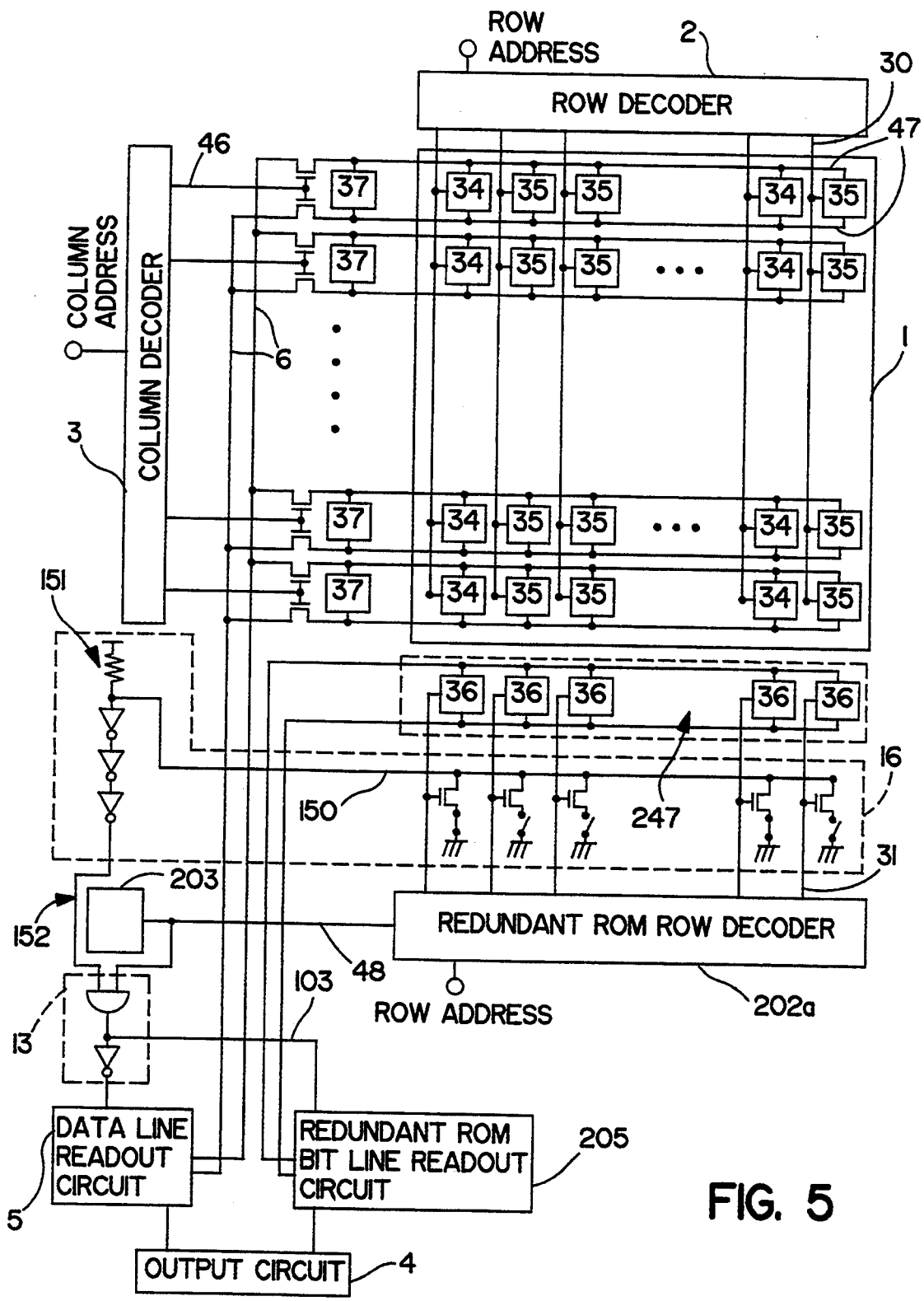
FIG. 5 shows a configuration for a semiconductor memory device according to Example 5 of the present invention.

FIGURE 5, inside block 16:
        Is: Switches are shown between ground symbols and transistors.
        Should be: No switches should be shown between ground symbols and transistors.

Figure 14:
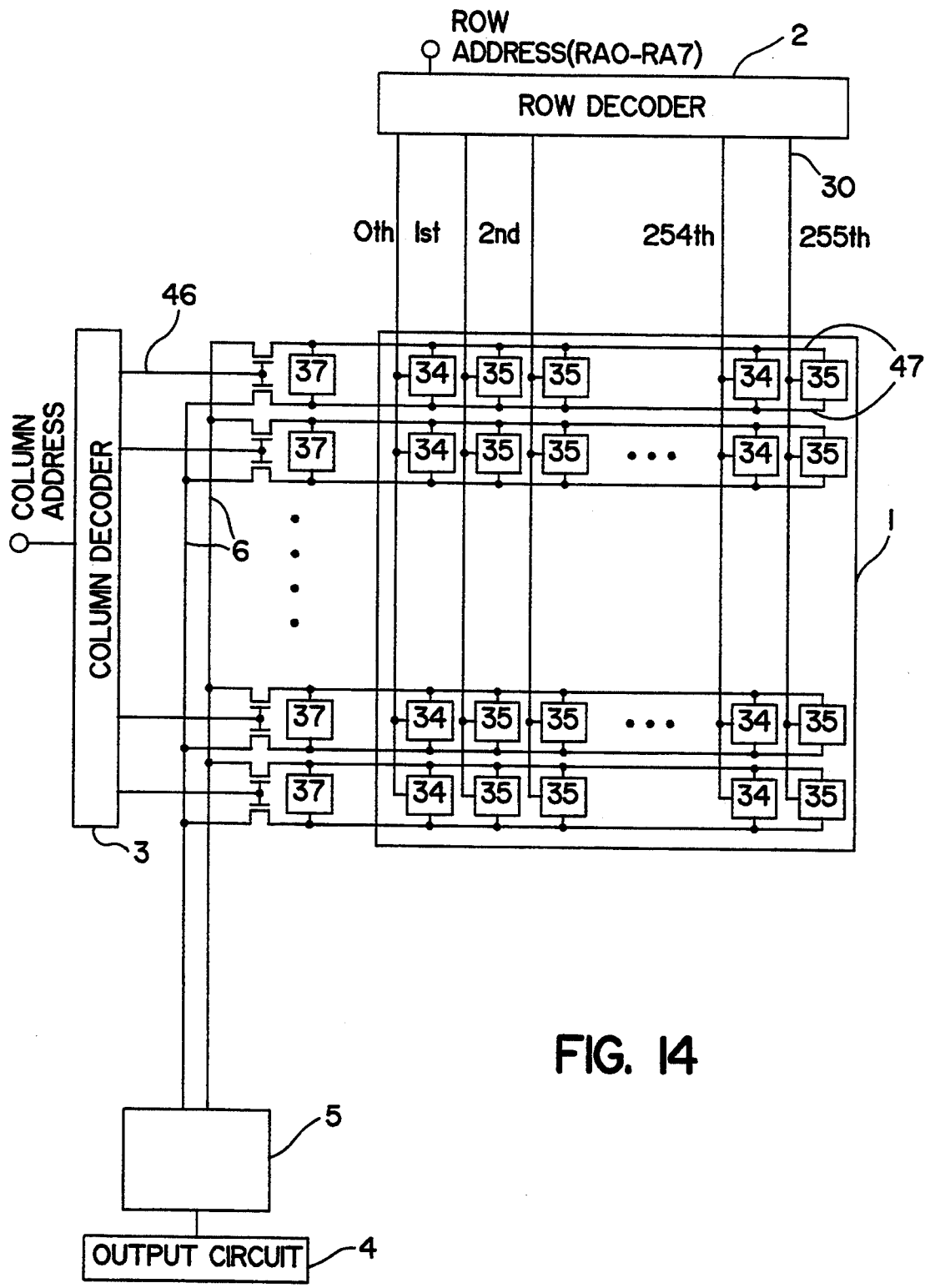
FIG. 14 shows a configuration for a semiconductor memory device in which ROM cells and RAM cells are both present on one line (a column or row line).
Figure 15:
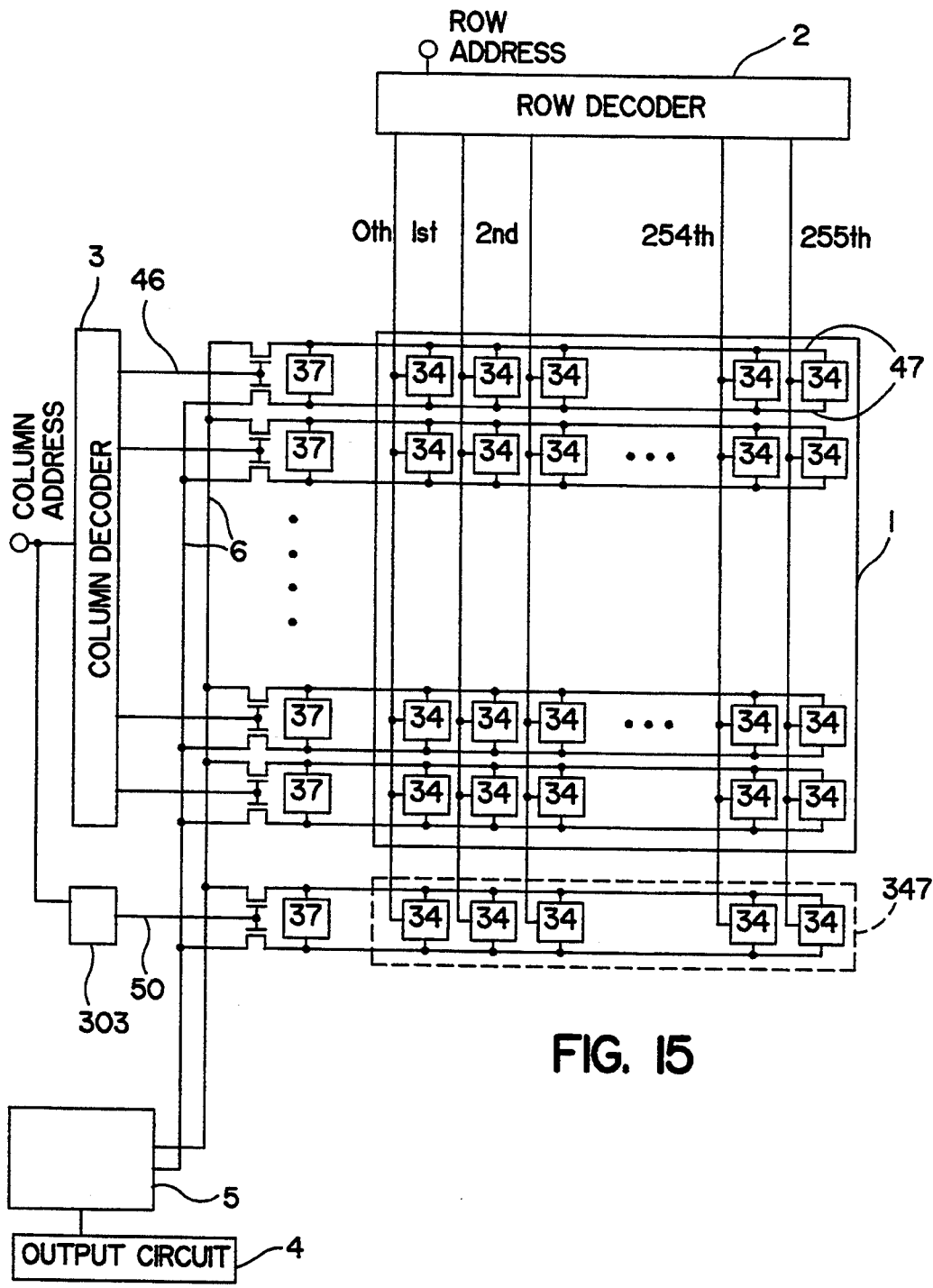
FIG. 15 shows a configuration for a conventional semiconductor memory device having a memory cell array including RAM cells and redundant RAM cells.
Figure 16:
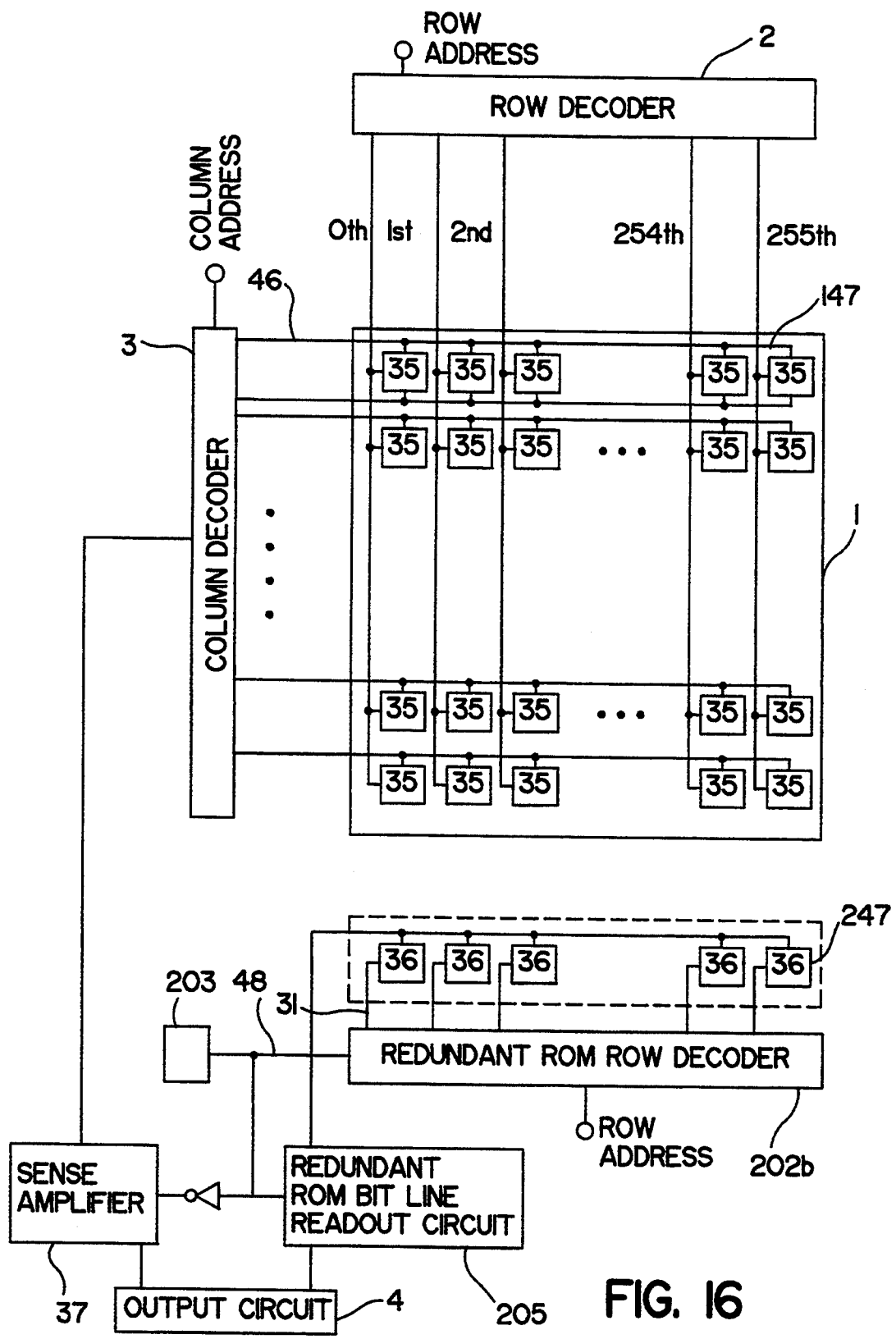
FIG. 16 shows a configuration for a conventional semiconductor memory device having a memory cell array including ROM cells and redundant ROM cells.
Figure 17:
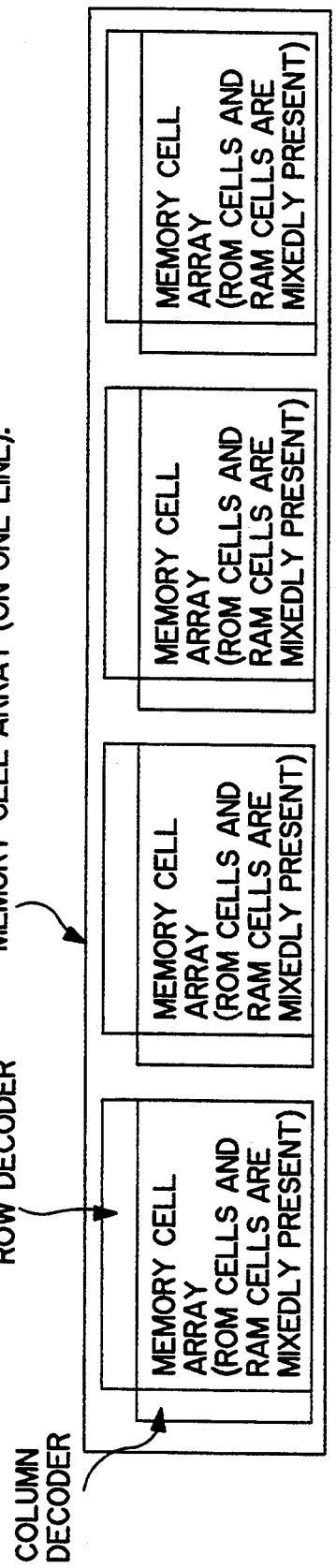
FIG. 17 schematically shows the construction of a semiconductor memory device in which RAM cells and ROM cells are both present in one memory cell array.
Figure 18:
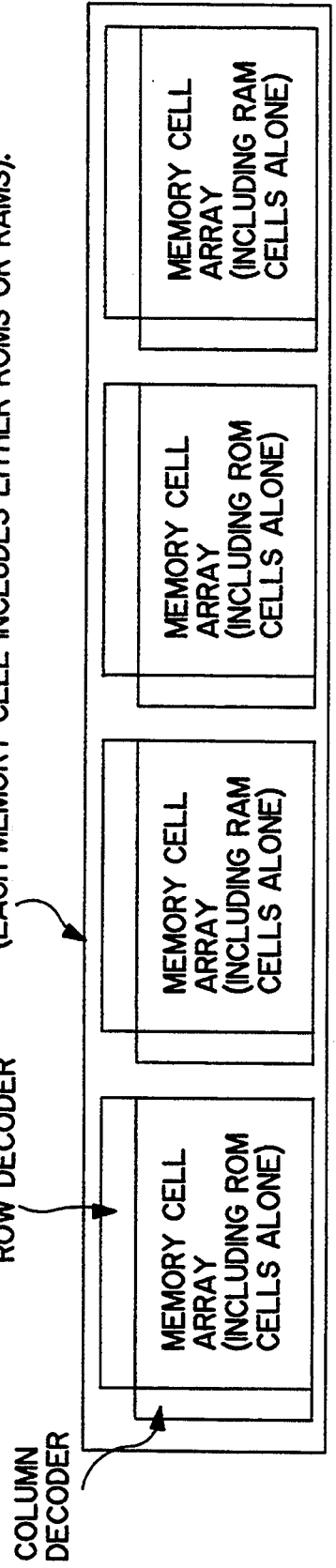
FIG. 18 schematically shows the construction of a semiconductor memory device having RAM cell arrays and ROM cell arrays.
Figure 19:
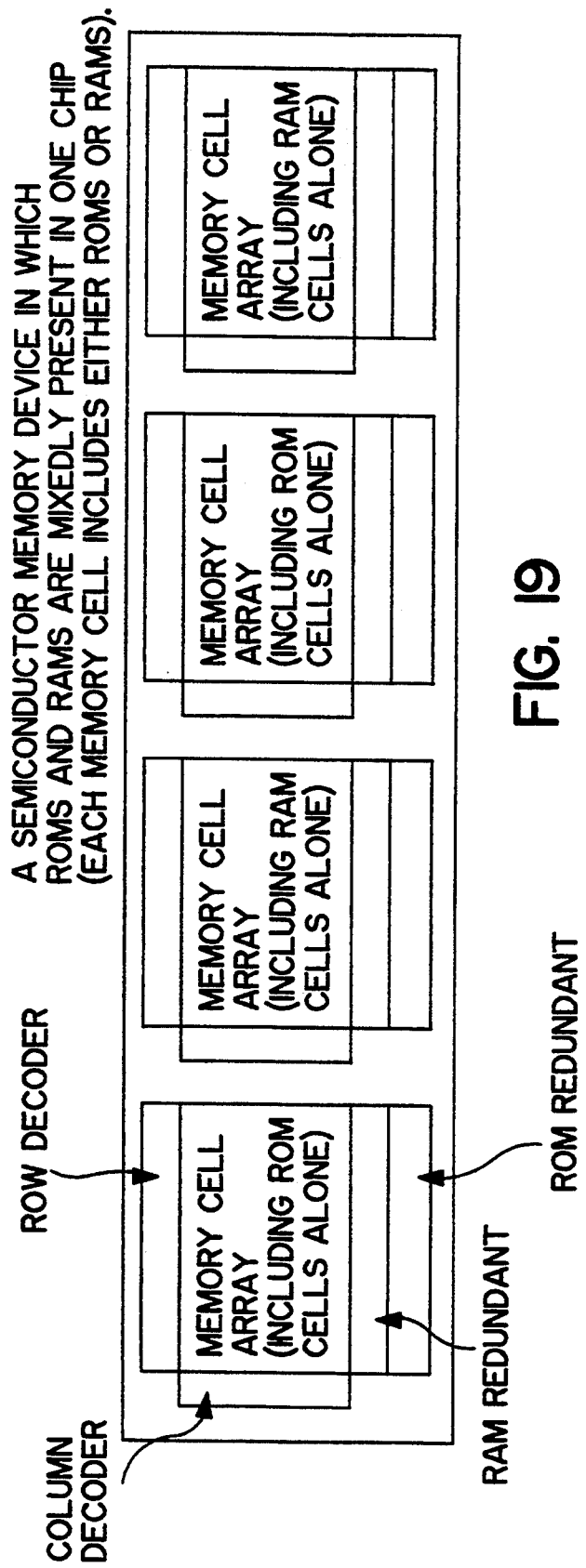
FIG. 19 schematically shows the construction of a semiconductor memory device having RAM cell arrays, ROM cell arrays, redundant ROM cells and redundant RAM cells.
Figure 20A:
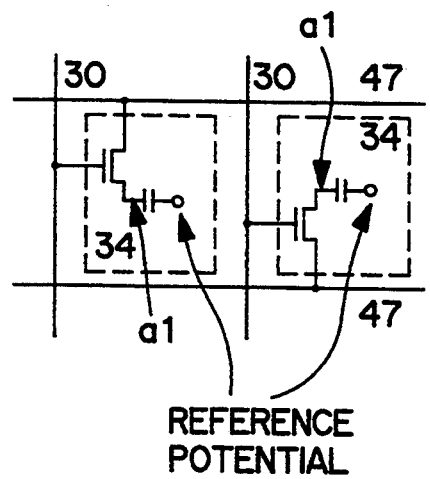
FIGS. 20a through 20f show examples of a RAM cell, a ROM cell, a SRAM cell, another ROM cell, a redundant ROM cell and a mask ROM cell, respectively.
Figure 20B:
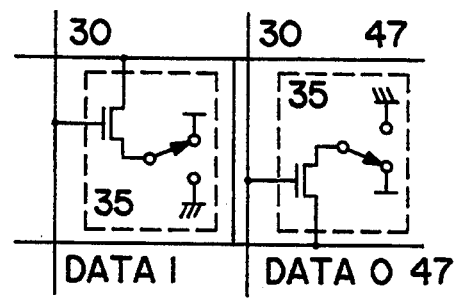
Figure 20C:
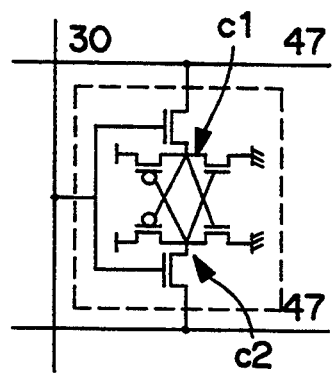
Figure 20D:
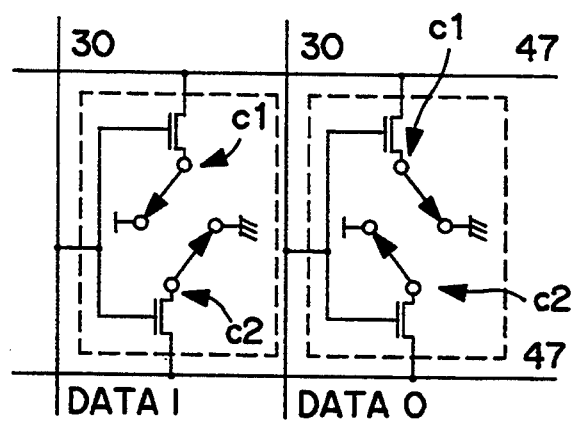
Figure 20E:
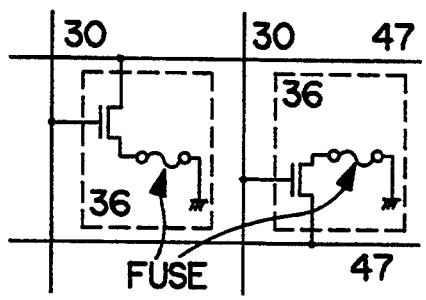
Figure 20F:
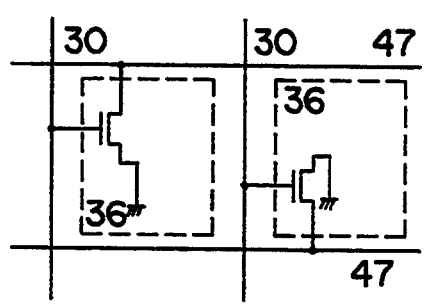
Figure 21:
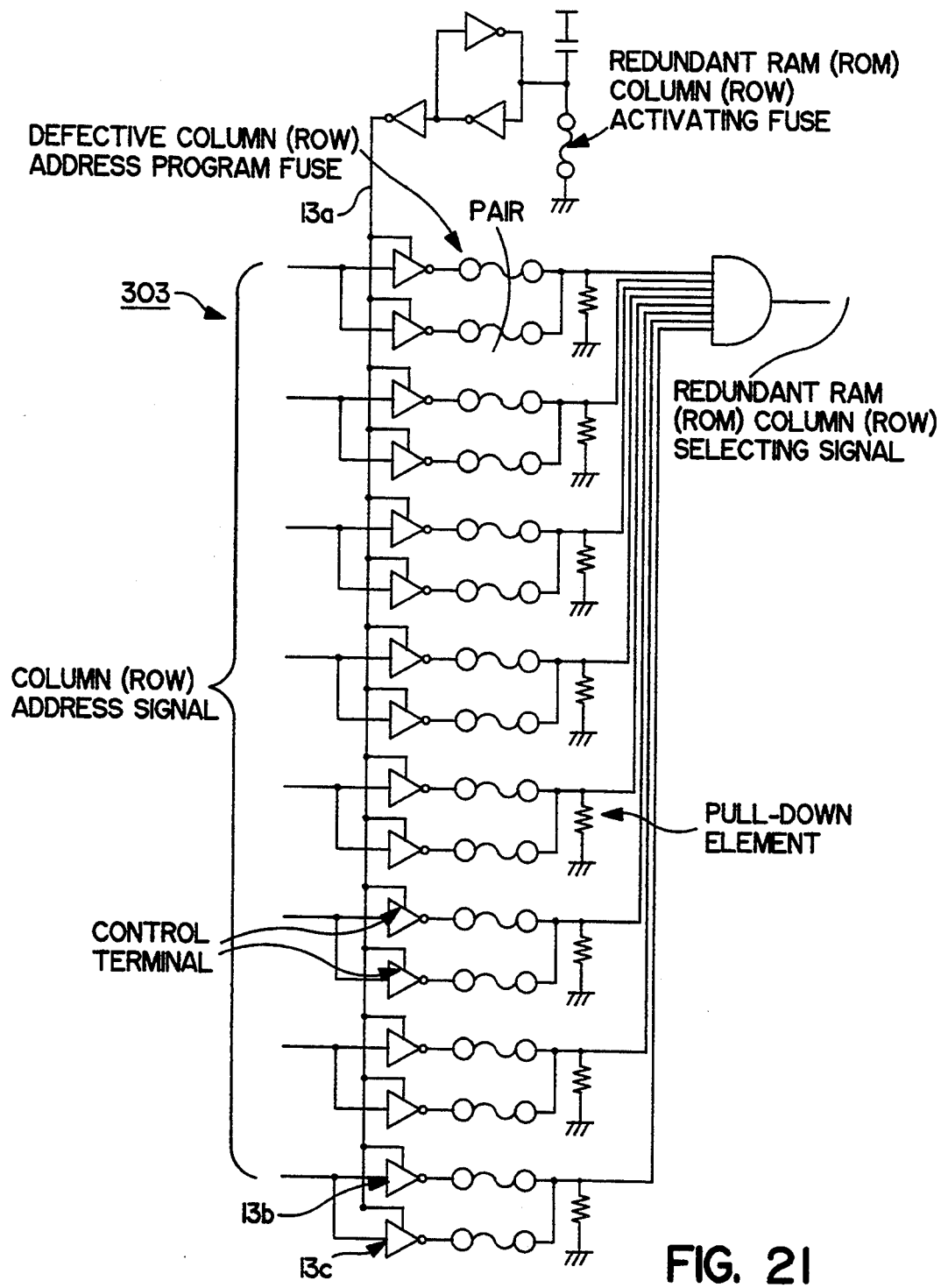
FIG. 21 shows a configuration for a redundant RAM (ROM) column (row) decoder.
Figure 22:
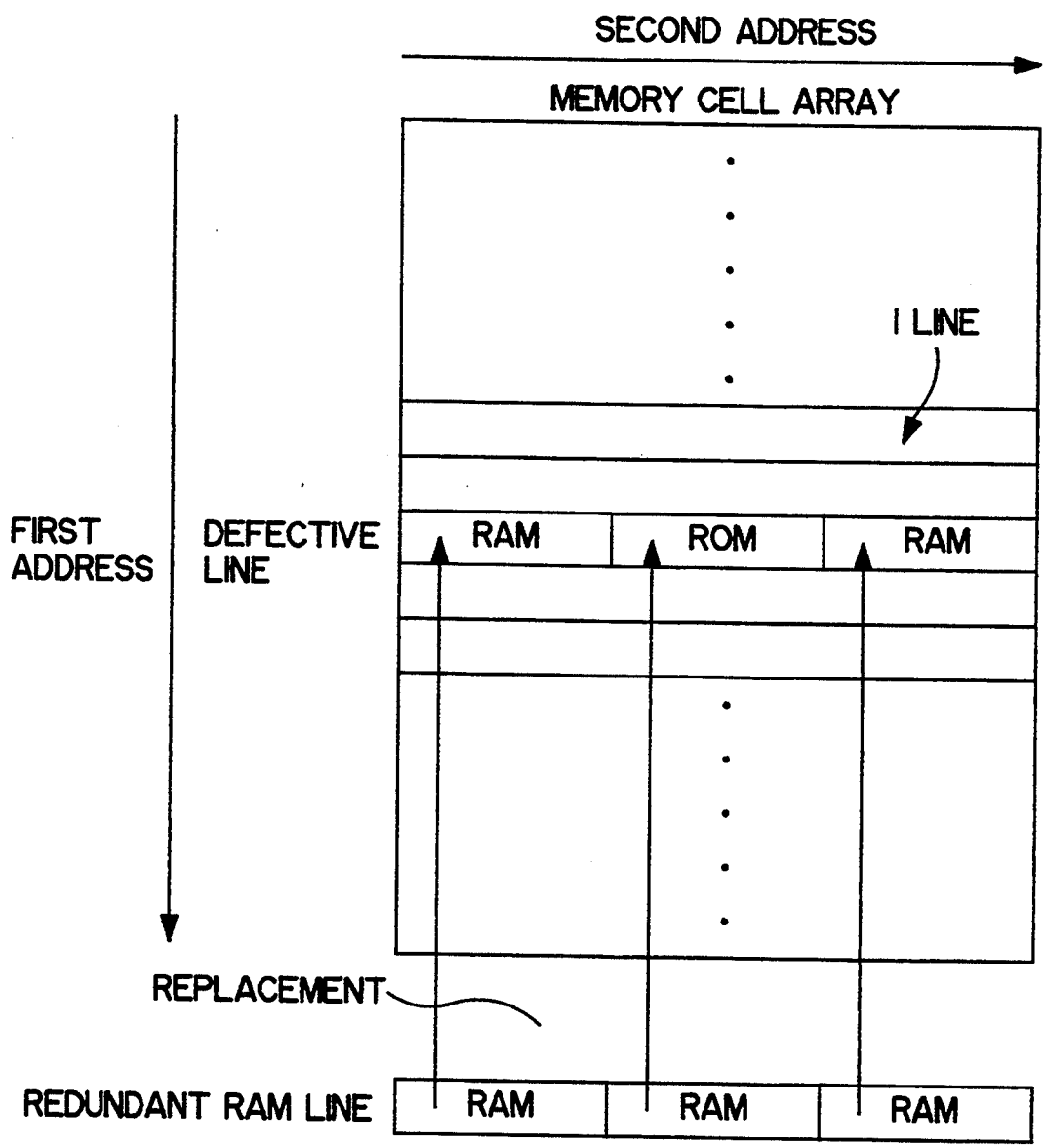
FIG. 22 is a diagram showing redundant replacement of a defective line including both RAMs and ROMs with redundant RAMs.
Figure 23:
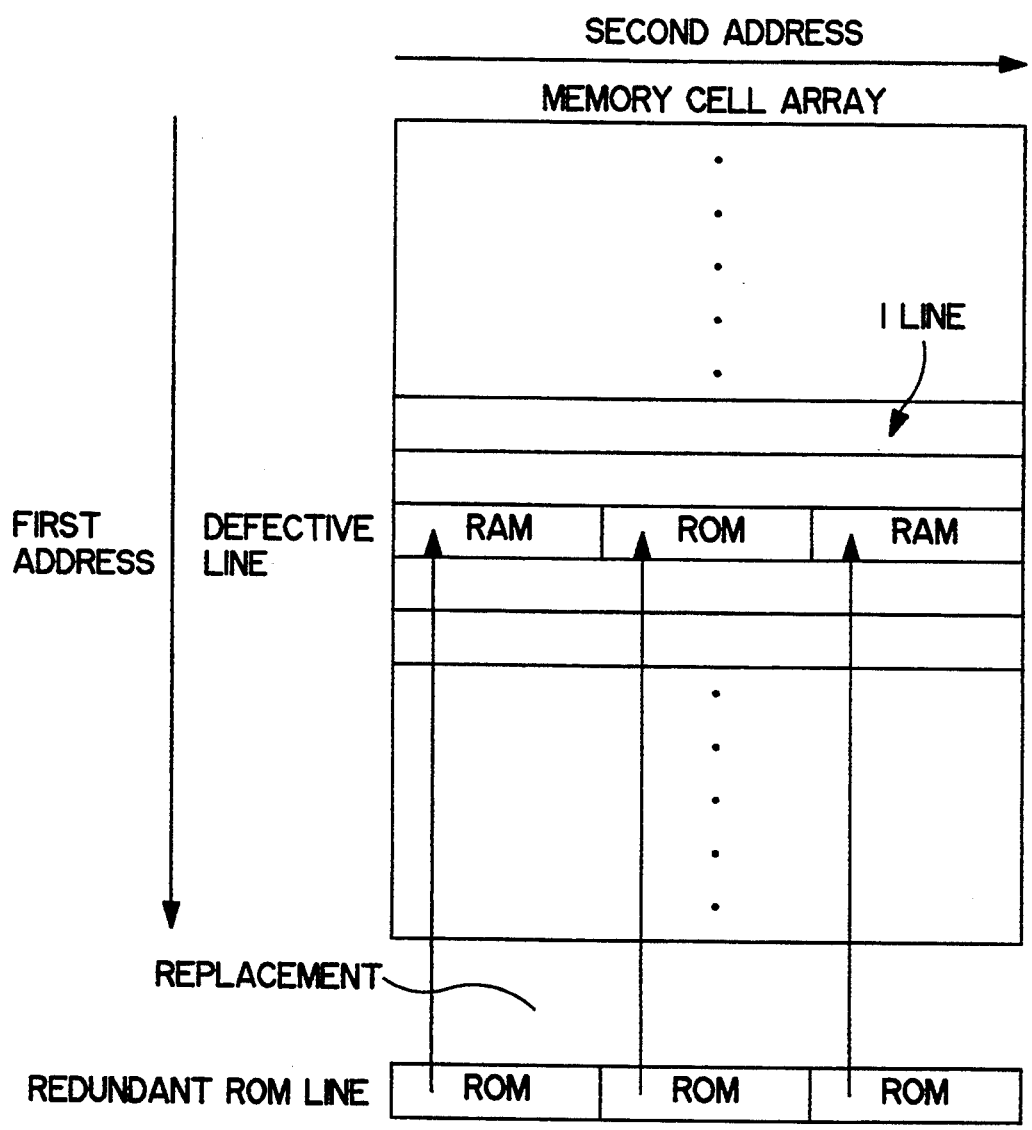
FIG. 23 is a diagram showing redundant replacement of a defective line including both RAMs and ROMs with redundant ROMs.
Figure 24:
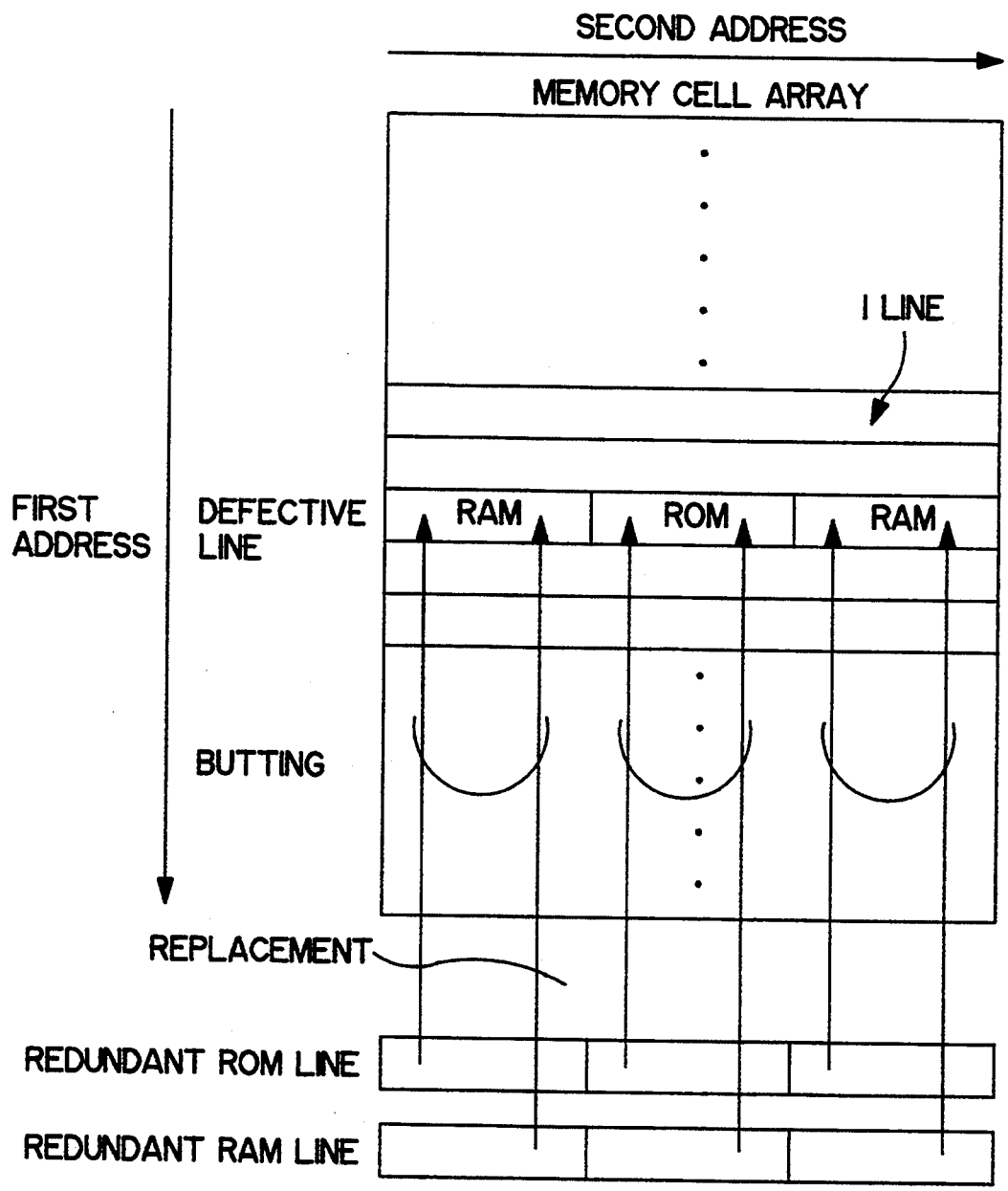
FIG. 24 is a diagram showing redundant replacement of a defective line including both ROMs and RAMs with redundant RAMs and redundant ROMs.

FIGURE 11b
        Is: "COLUMN ADDRESS" should read --ROW ADDRESS--;
        Is: "COLUMN DECODER" should read --ROW DECODER--;

FIGURE 14:
        Is "FIG. 14" should read --FIG. 14 PRIOR ART--;

FIGURE 15:
        Is "FIG. 15" should read --FIG. 15 PRIOR ART--;

FIGURE 16:
        Is "FIG. 16" should read --FIG 16 PRIOR ART--.

Signed and Sealed this

Thirtieth Day of May, 1995

Attest:

BRUCE LEHMAN

Attesting Officer      Commissioner of Patents and Trademarks